US010205301B2

(12) United States Patent
Evans et al.

(10) Patent No.: US 10,205,301 B2
(45) Date of Patent: Feb. 12, 2019

(54) TUNABLE WAVEGUIDE DEVICES

(71) Applicant: Infinera Corporation, Sunnyvale, CA (US)

(72) Inventors: Peter W Evans, Tracy, CA (US);
Mingzhi Lu, Fremont, CA (US); Fred A. Kish, Jr., Palo Alto, CA (US);
Vikrant Lal, Sunnyvale, CA (US);
Scott Corzine, Sunnyvale, CA (US);
John W. Osenbach, Kutztown, PA (US); Jin Yan, Paoli, PA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 15/866,148

(22) Filed: Jan. 9, 2018

(65) Prior Publication Data

US 2018/0331498 A1 Nov. 15, 2018

Related U.S. Application Data

(63) Continuation of application No. 15/398,690, filed on Jan. 4, 2017.

(Continued)

(51) Int. Cl.
*H01S 5/00* (2006.01)
*H01S 5/10* (2006.01)
(Continued)

(52) U.S. Cl.
CPC .......... *H01S 5/1017* (2013.01); *H01S 5/0261* (2013.01); *H01S 5/02453* (2013.01); *H01S 5/02461* (2013.01); *H01S 5/0425* (2013.01); *H01S 5/0612* (2013.01); *H01S 5/06256* (2013.01); *H01S 5/1003* (2013.01);
(Continued)

(58) Field of Classification Search
CPC ........ H01S 5/0612; H01S 5/0425; H01S 5/22; H01S 5/3013; H01S 5/1003; H01S 5/0261; H01S 5/02453; H01S 5/02461; H01S 5/1017
See application file for complete search history.

(56) References Cited

U.S. PATENT DOCUMENTS 6,647,032 B1 * 11/2003 Lee .................. H01S 5/026
372/20
7,058,246 B2 * 6/2006 Joyner ............... G02B 6/12019
385/14

(Continued)

*Primary Examiner* — Kinam Park
(74) *Attorney, Agent, or Firm* — David L. Soltz

(57) ABSTRACT

Methods, systems, and apparatus, including a laser including a layer having first and second regions, the first region including a void; a mirror section provided on the layer, the mirror section including a waveguide core, at least part of the waveguide core is provided over at least a portion of the void; a first grating provided on the waveguide core; a first cladding layer provided between the layer and the waveguide core and supported by the second region of the layer; a second cladding layer provided on the waveguide core; and a heat source configured to change a temperature of at least one of the waveguide core and the grating, where an optical mode propagating in the waveguide core of the mirror section does not incur substantial loss due to interaction with portions of the mirror section above and below the waveguide core.

30 Claims, 32 Drawing Sheets

Related U.S. Application Data

(60) Provisional application No. 62/379,682, filed on Aug. 25, 2016, provisional application No. 62/274,377, filed on Jan. 4, 2016.

(51) Int. Cl.

| | |
|---|---|
| *H01S 5/0625* | (2006.01) |
| *H01S 5/06* | (2006.01) |
| *H01S 5/024* | (2006.01) |
| *H01S 5/026* | (2006.01) |
| *H01S 5/042* | (2006.01) |
| *H01S 5/30* | (2006.01) |
| *H01S 5/22* | (2006.01) |
| *H01S 5/32* | (2006.01) |
| *H01S 5/20* | (2006.01) |
| *H01S 5/12* | (2006.01) |

(52) U.S. Cl.
CPC .............. *H01S 5/22* (2013.01); *H01S 5/3013* (2013.01); *H01S 5/1014* (2013.01); *H01S 5/1215* (2013.01); *H01S 5/2081* (2013.01); *H01S 5/3214* (2013.01); *H01S 2301/176* (2013.01)

(56) References Cited

U.S. PATENT DOCUMENTS

| | | | |
|---|---|---|---|
| 8,179,931 B2* | 5/2012 | Arimoto | G02F 1/3133 372/102 |
| 9,647,424 B2* | 5/2017 | Lin | H01S 5/026 |
| 2005/0058425 A1* | 3/2005 | Berini | G02B 6/12007 385/147 |
| 2010/0311195 A1* | 12/2010 | Matsui | B82Y 20/00 438/31 |
| 2013/0016744 A1* | 1/2013 | Li | H01S 5/1039 372/20 |
| 2015/0010264 A1* | 1/2015 | Kaneko | H01S 5/06256 385/10 |
| 2015/0333482 A1* | 11/2015 | Briggs | H01S 5/3402 372/45.01 |

* cited by examiner

901 ⤴

| Reflector (BCB cleared) | Phase Section (BCB cleared) | Gain Section (BCB cleared) | Reflector (BCB cleared) |
|---|---|---|---|
| 932 | 936 | 938 | 934 |

| Reflector (BCB cleared) | Phase Section (BCB cleared) | Gain Section (BCB present) | Reflector (BCB cleared) |
|---|---|---|---|
| 942 | 946 | 948 | 944 |

*FIG. 9C*

TUNABLE WAVEGUIDE DEVICES

CROSS-REFERENCE TO RELATED APPLICATION

This patent application is a continuation of U.S. patent application Ser. No. 15/398,690 filed on Jan. 4, 2017, which claims the benefit of U.S. Provisional Patent Application No. 62/274,377, filed Jan. 4, 2016, and U.S. Provisional Patent Application No. 62/379,682, filed Aug. 25, 2016, each of which is incorporated by reference herein in its entirety.

TECHNICAL FIELD

The present disclosure is directed to tunable waveguide optical devices. In general, a heater may be used to change a characteristic of an optical device. For example, an operating wavelength of a semiconductor laser may be tuned by applying heat using a heater.

SUMMARY

In a general aspect, the subject matter described in this specification can be embodied in a laser including a layer having first and second regions, the first region including a void; a mirror section provided on the layer, the mirror section including a waveguide core, at least part of the waveguide core is provided over at least a portion of the void; a first grating provided on the waveguide core; a first cladding layer provided between the layer and the waveguide core and supported by the second region of the layer; a second cladding layer provided on the waveguide core; and a heat source configured to change a temperature of at least one of the waveguide core and the grating, where an optical mode propagating in the waveguide core of the mirror section does not incur substantial loss due to interaction with portions of the mirror section above and below the waveguide core.

The details of one or more implementations are set forth in the accompanying drawings and the description below. Other potential features and advantages will become apparent from the description, the drawings, and the claims.

BRIEF DESCRIPTION OF THE FIGURES

FIGS. 8 and 9A-9C show examples of heater placement adjacent to a gain section.

Like reference numbers and designations in the various drawings indicate like elements.

DETAILED DESCRIPTION

Figure 1:
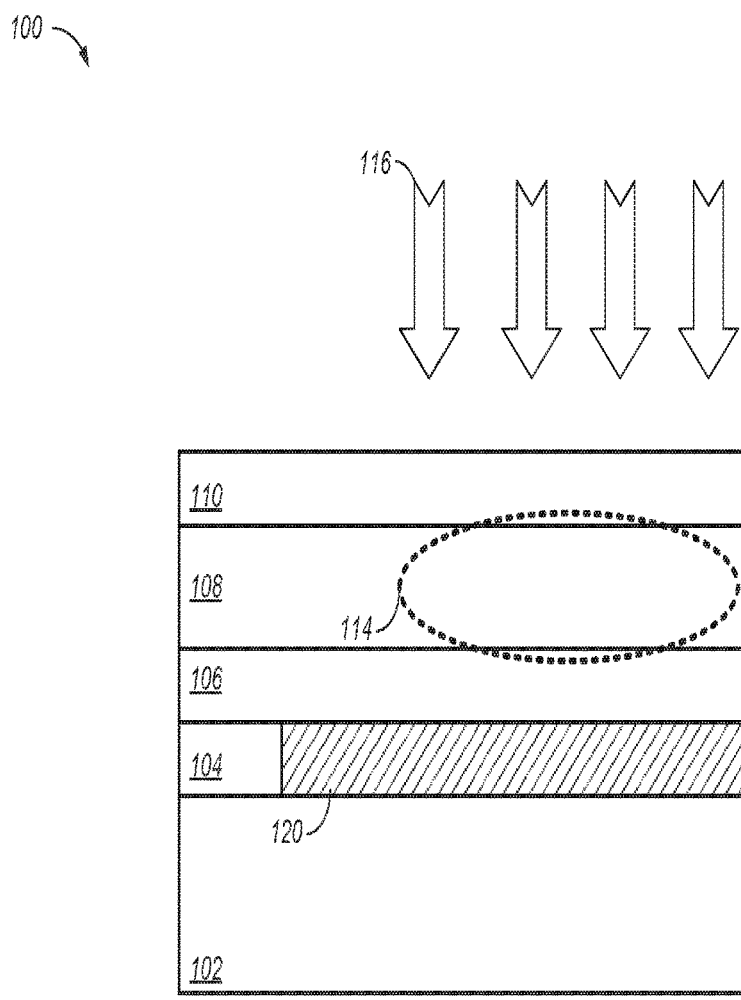
FIG. 1 illustrates a cross-section view of an example tunable waveguide device.

A tunable laser enables an operating wavelength of a laser to be adjusted over a tunable wavelength range. Tunable lasers such as semiconductor laser diodes typically have a gain section and an optional phase section provided between a pair of reflectors or mirrors (the terms "reflector" and "mirror" may be used interchangeably herein). The gain section includes a p-n junction, and the phase section adjusts the phase of light in the laser cavity between the reflectors. A reflector may be a grating-based reflector, which includes a waveguide having a periodic refractive index variation corresponding to a particular wavelength of light output from the laser. For example, the reflectors have a reflectivity characteristic that may include a series of uniformly spaced reflection peaks, which resemble a comb. The spectral distance between successive peaks in the comb or pitch of one reflector may be different than the spectral distance between successive peaks of the other reflector. Each "comb" may be spectrally shifted by tuning the reflectors and phase sections to select a single wavelength over a wide range, such as the C-Band (1530-1565 nm) or L-Band (1565-1625 nm), when the reflector pitches are different and designed appropriately. The grating-based reflector may be a partial reflector and be partially reflective or a total reflector and be completely reflective or nearly completely reflective.

In some implementations, the grating-based reflectors may be used to tune the wavelength of light output from the laser. For example, an operating wavelength of a laser may be tuned using heaters that are provided above and/or adjacent to the grating-based reflectors. In an exemplary tuning operation, the heaters adjust the temperature of the grating-based reflectors, such that the entire reflection comb shifts in wavelength. When both mirrors are tuned together, the laser wavelength tunes continuously but does not provide for much change in wavelength. When the mirrors are tuned differently with respect to each other, the laser wavelength may hop discretely and therefore change the wavelength in larger steps. Together, common mode and differential tuning of the mirrors allows the mirror to span a large and complete range of wavelengths. It may be desirable to thermally isolate the heat generated by the heaters in local regions to increase the efficiency of the tuning operation. Moreover, if multiple tunable lasers are integrated on a common substrate in a photonic integrated circuit (PIC), for example, it may be desirable to thermally isolate the heat generated by the heaters for one laser from the other lasers in order to maintain the stability of the tunable lasers on the PIC. The present disclosure is directed toward various laser and heater structures that provide for more efficient thermal tuning, as well as mechanical and electrical stability. For example, an undercut region may be formed under a tunable section (e.g., a grating-based reflector and/or a phase section) of a laser to thermally isolate the tunable section from other parts of the laser and other optical components formed on the PIC. In some implementations, the lasers disclosed in this disclosure may be tunable over the C (1530-1565 nm), L (1565-1625 nm) bands, extended C band, or extended L-Band.

The subject matter described in this specification can be implemented in particular embodiments so as to realize one or more of the following advantages. For example, by forming an undercut portion below a tunable section, the tunable section is thermally isolated or decoupled from the substrate. As a result, thermal tuning of the laser reflectors or mirrors may be more efficient. In another example, by forming heaters on a tunable laser, in which the ends of the heaters are tapered or narrowed compared to a center portion of the heater, more heat may be dissipated at the ends of the heater compared to a heater that has a uniform width. Accordingly, heat may be more uniformly dissipated by a heater having tapered ends consistent with an aspect of the present disclosure. In addition, the heater therefore may be made more compact, consume less power, and be more efficient.

FIG. 1 illustrates a cross-section view of an example tunable waveguide device 100. Waveguide device 100 may be provided on substrate 102 and may include a lower cladding 106, core 108, and upper cladding 110. As discussed in greater detail below, additional layers may be provided on upper cladding 106 as part of a laser. Undercut layer 104 having an etched region or space 120 (as used herein "undercut" and "etched" may be used interchangeably) is formed under a lower cladding 106 in order to thermally isolate waveguide device 100 from substrate 102. Other devices, not shown in FIG. 1, may be laterally disposed adjacent to waveguide device 100, and etched region 120 may thermally isolate waveguide device 120 from those other devices as well. As disclosed in greater detail below with references to FIGS. 2-20, the tunable waveguide device 100 may be a tunable section, e.g., a reflector or a phase section of a semiconductor laser. In other implementations, the tunable waveguide device 100 may be a tunable section of a modulator, an optical switch, a multiplexer, a demultiplexer, or any other suitable tunable waveguide devices that may be controlled by temperature.

The substrate 102 may include silicon, indium-phosphide (InP), or any other suitable substrate including Group IV or Group III-V semiconductor materials in which optical devices may be formed thereon. Substrate 102 may also be doped. In one example, substrate 102 may include silicon-doped InP. The lower-cladding layer 106 and the upper-cladding layer 110 may be formed using materials that have a lower refractive index than the refractive index of the core layer 108, such that an optical mode 114 may be confined by the lower-cladding layer 106 and the upper-cladding layer 110 to propagate in the core layer 108. The undercut layer 104 may be formed using materials that are etched at a faster rate than the other layers, such that the etched region 120 may be formed selectively while the other layers of waveguide device remain intact.

In general, a temperature change may induce refractive index changes in the lower-cladding layer 106, the core layer 108, and the upper-cladding layer 110, which changes an effective refractive index of the optical mode 114. The change in the effective refractive index of the optical mode 114 may be used to control an optical characteristic of the tunable waveguide device 100. For example, if the tunable waveguide device 100 is a laser, an operating wavelength of a tunable laser may be changed using a temperature control 116, as noted above. As another example, if the tunable waveguide device 100 is an arm of a Mach-Zehnder interferometer (MZI), a phase shift by the MZI arm may be changed using a temperature control 116. A source for a temperature control 116 may be a heater formed on the upper-cladding layer 110 or an electrical source that heats up the tunable waveguide device 100 by passing a current through the lower-cladding layer 106 and/or the upper-cladding layer 110.

The etched region 120 is formed by etching away a portion of the undercut layer 104. For example, the etched region 120 may be formed by exposing portions of the undercut layer 104 using lithography, and then wet etching the exposed portions. The etched region 120 may be empty or may be filled with another material having a high thermal resistance. The etched region 120 increases the thermal resistance, to reduce heat flow to the substrate 102, and therefore enhances a thermal isolation of the tunable waveguide device 100, as noted above.

Figure 2A:
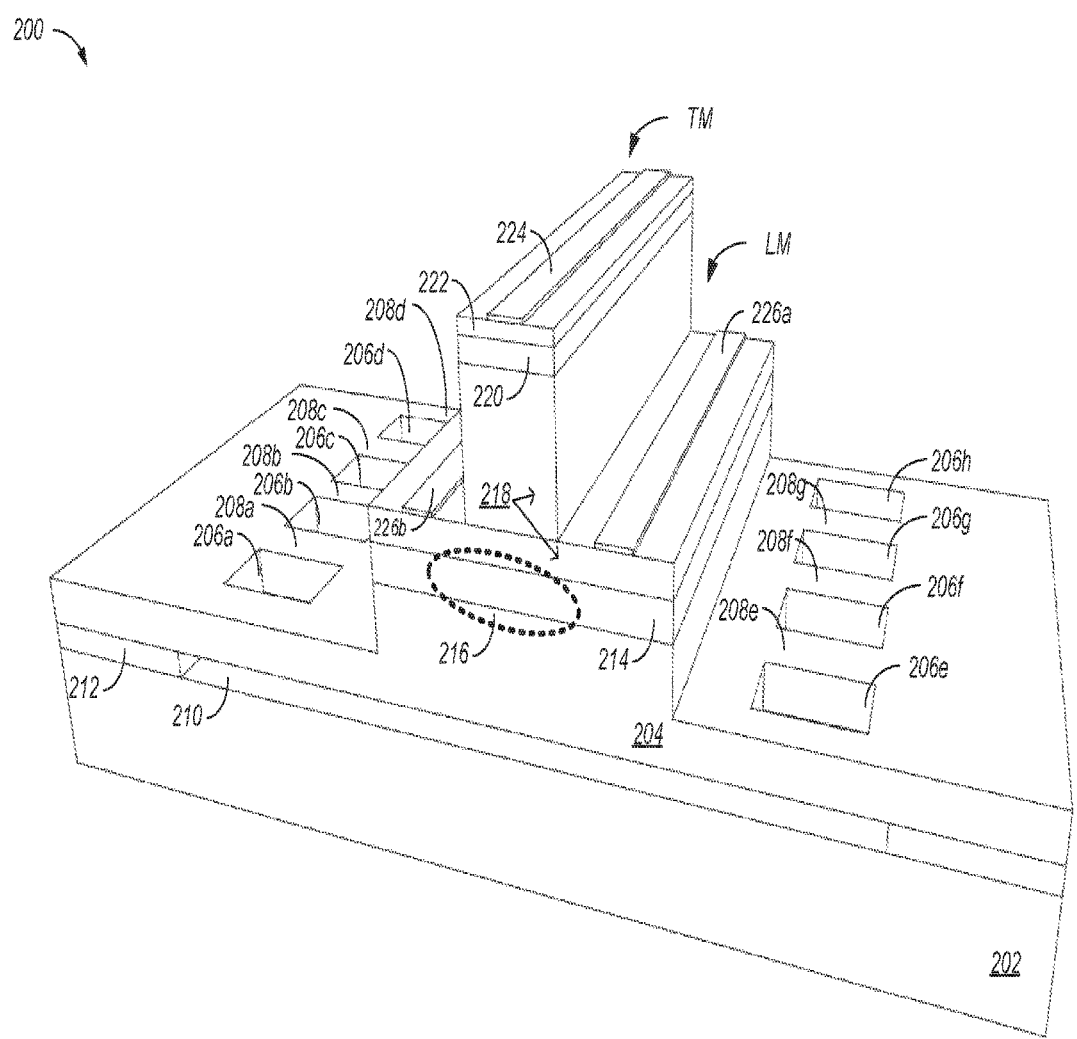
FIG. 2A illustrates an example tunable section of a tunable laser.
Figure 2B:
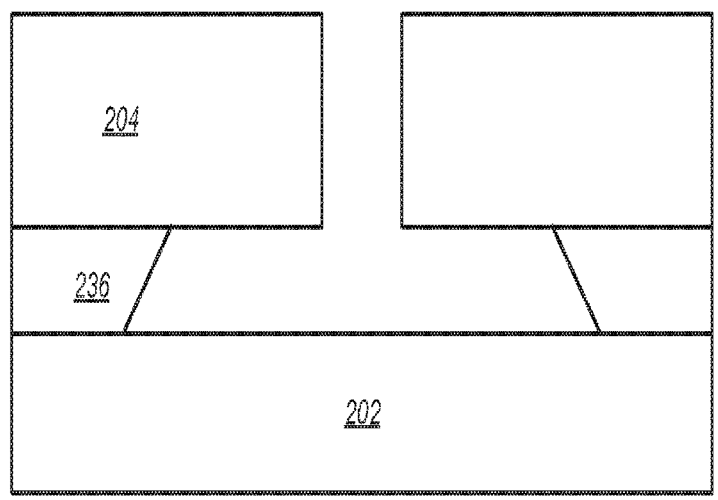
FIGS. 2B and 2C illustrate example etch profiles.
Figure 2C:
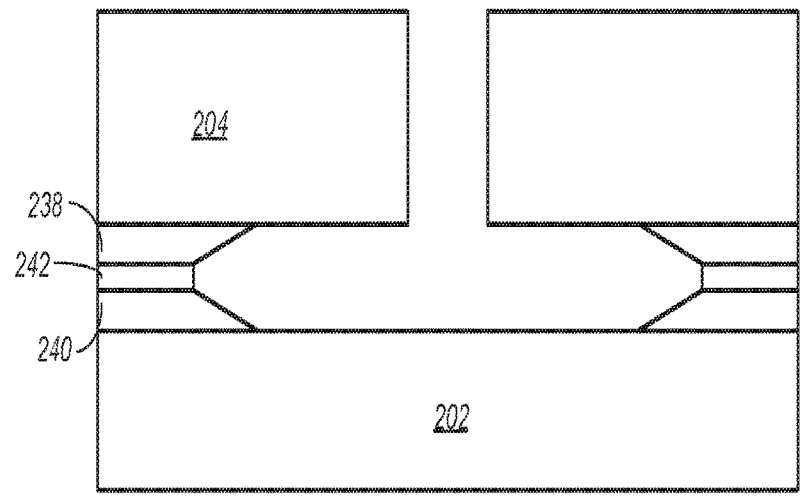

FIG. 2A illustrates an example tunable section 200 of a tunable laser. The tunable section 200 may be a reflector or a phase section of a tunable laser. In this example, the tunable section 200 is formed on a substrate 202. The substrate 202 may be a n-doped indium phosphide substrate (for instance InP:S, InP:Se, InP:Si) or a semi-insulating (SI) InP substrate (e.g., InP:Fe). The tunable section 200 includes a lower-cladding layer 204 formed on the substrate 202. In this example, the lower-cladding layer 204 is an n-type epitaxial layer of n-type InP. The n-type epitaxial layer 204 may be designed, patterned, and etched to form holes or openings ("undercut access openings") 206a-206h. In this example, the tunable section 200 shows eight undercut access openings. In another example, a tunable section may have fewer or more undercut access openings depending on the design. The undercut access openings 206a-206h are separated from each other by non-etched portions or "legs" 208a-208g. The legs 208a-208g may be patterned by using a dielectric material as an etch mask, such as SiN or $SiO_2$ or a combination of dielectric layers, or a combination of semiconductor layers, or both. The undercut access openings 206a-206h provide access for a wet etchant that etches beneath the lower cladding layer 204 to create an undercut/void/spacing (used interchangeably in this disclosure) 210. In one example, the undercut portion may be formed by etching an undercut layer 212. The undercut layer 212 may be formed using indium gallium arsenide phosphide ("InGaAsP") or indium gallium arsenide ("InGaAs"), which has been embedded with aluminum indium arsenide ("AlInAs" or interchangeably "InAlAs") or aluminum gallium indium arsenide ("AlGaInAs" or interchangeably "InAlGaAs"). Both AlInAs and AlGaInAs typically have relatively high etch rates (e.g., three times faster or more) compared to InGaAsP and InGaAs, such that the time required to form the undercut 210 can be reduced and with less optical loss to the undercut layer 212. In addition, the resultant semiconductor profile may be more tapered. As an example, FIG. 2B illustrates an example etch profile 201 that includes an undercut layer 236 formed using InGaAs. FIG. 2C illustrates an example etch profile 203 that includes an undercut layer formed using an InGaAs layer 238, an AlGaInAs or AlInAs layer 242, and another InGaAs layer 240. The etch profile 203 is more tapered than the etch profile 201 because of less steep slope. Increased etch rates may also be achieved by introducing strain into the undercut layer 212 by a lattice mismatch. In general, an undercut void may be formed in the reflectors (or mirrors) and phase-tuning sections but preferably not the gain section in order to keep the operating temperature of this section minimized (for improved performance and reliability). The thickness of an undercut layer, e.g., undercut layer 212 or another undercut layer disclosed in this application, may be less than 2 µm or less than 1 µm.

By forming the undercut or etched region 210, the waveguide device of the tunable section 200 may be thermally isolated or decoupled from the substrate 202. As a result, thermal tuning of the laser reflectors, for example, is more efficient.

As further shown in FIG. 2A, the tunable section 200, which may be a reflector, includes a waveguide core layer 214 through which an optical mode 216 propagates. The core layer 214 may include intrinsic or non-intentionally doped (NID) InP or else n-type InP. The optical mode 216 may extend outside the waveguide core layer 214 and into the lower cladding layer 204 and an upper cladding layer 218.

The upper cladding layer 218 may be provided on the waveguide core layer 214 throughout the photonic integrated circuit and includes the laser reflectors. The upper cladding layer 218 may include InP that is doped p-type and formed from a single epitaxial growth step. Optionally, the upper cladding layer 218 may include a layer of n-type doping having a concentration of $10^{17}$ cm$^{-3}$ above or otherwise spaced from the waveguide core layer 214 to deplete holes adjacent to and especially near waveguide core 214 and thereby reduce optical loss of the waveguide. Alternatively, the upper cladding layer 218 may include a layer that is unintentionally doped (e.g., very low impurity levels for lower loss) or passivated with an implant or counter doping (e.g., H or He for p-type, or O for either p or n-type). This may occur in all or part of the layers in the reflector, but preferably the layers closest to the core of the waveguide core layer 214 (with the highest optical overlap).

In some implementations, a p-type InGaAsP layer 220 may be provided on the upper cladding layer 218 in a single or multiple step compositional grade between InGaAs and InP. In some implementations, a p+ InGaAs contact layer 222 may be formed on the p+ or p-type InGaAsP layer 220 or InP cladding layer. Graded composition layers having increasing bandgap may also be formed going from the InGaAs contact layer 222 to the InGaAsP layer 220 below. A strip heater 224 may be formed above the p+ InGaAs contact layer 222 or on any layer on top of the InP upper cladding layer wherein it is desirable to place the heaters sufficiently far from the vertical extent of the optical mode to result in minimal optical loss by the optically lossy heater material (typically at least 2-2.5 um from the waveguide core layer (214) to ensure minimal excess absorption per unit length (<2-7 dB/cm) in such waveguides, although other thicknesses may also be employed). In some implementations, strip heaters 226a and 226b may be formed on the "lower mesa" LM adjacent respective sides of the p-type upper-cladding layer 218 in addition to or instead of heater 224 provided on top mesa TM. By placing the heaters 226a and 226b on lower mesa LM, overall stress to tunable section 200 may be reduced.

In general, the height of the lower cladding layer 204 should be selected such that the optical mode 216 does not extend into the etched region 210, in order to minimize optical loss. For example, the thickness or distance in the lower cladding 204 between the undercut layer 212 and the waveguide core layer 214 is preferably at least 2.5 µm (in InP or about 1.2 µm in AlGaAs) to ensure minimal excess absorption per unit length (<1 dB/cm) in such waveguides, although other thicknesses may also be employed.

In the example described with reference to FIG. 2A, heaters made of metal strips are incorporated into tunable section 200 in order to thermally tune the wavelength of light output from the laser in which tunable section 200 is provided. As described with reference to FIGS. 3-5 below, instead of using heaters, semiconductor structures of the laser may be configured to generate heat, and thus may replace or supplement the metal heaters described above to simplify and/or lower the cost of device fabrication, as well as reduce stress to the upper cladding layer 218.

Figure 3A:
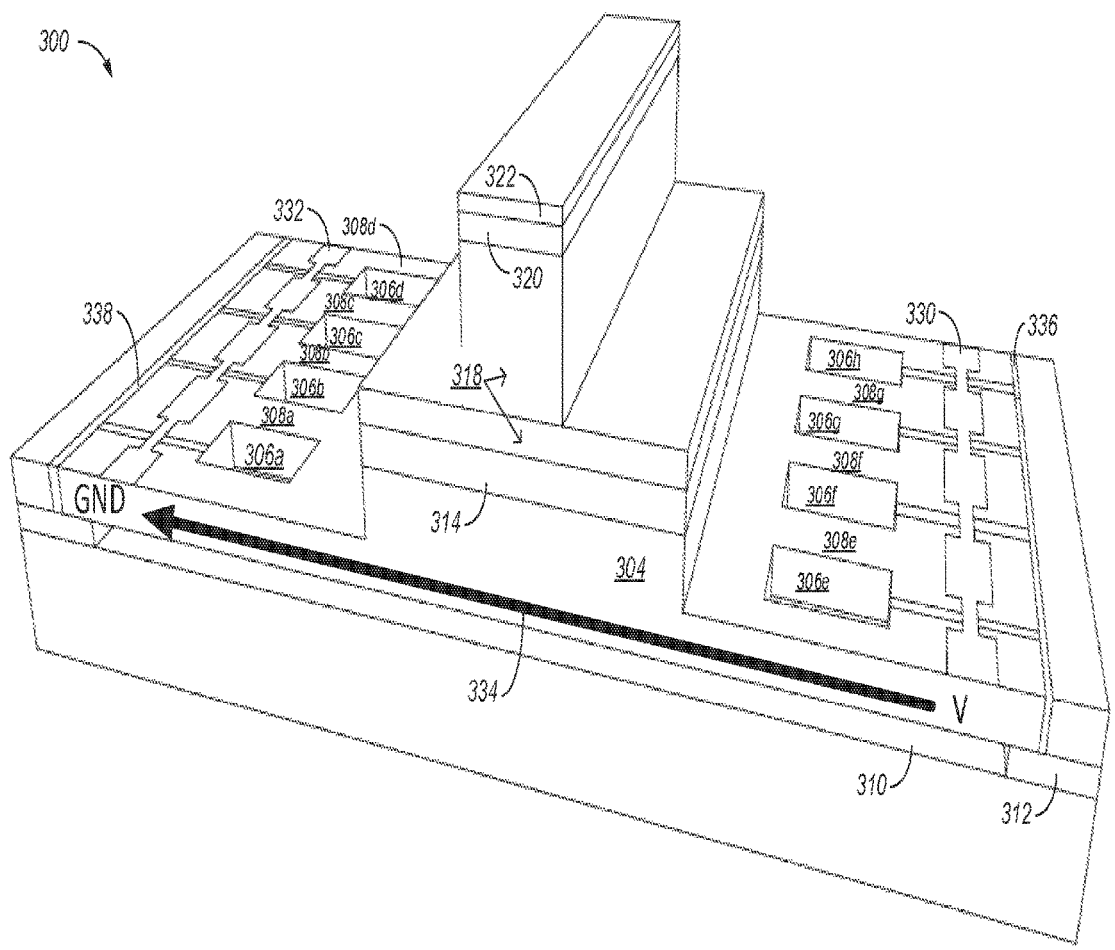
FIGS. 3A-3C illustrate an example tunable section of a tunable laser in which no heater is provided on the top of the upper cladding layer.

FIG. 3A illustrates an example tunable section 300 of a tunable laser in which no heater is provided on the top of the upper cladding layer 318. Tunable section 300 may be a reflector, for example. Tunable section 300 may have corresponding elements similar to those discussed above in connection with FIG. 2A. In particular, tunable section 300 includes a lower cladding layer 304, an undercut or etched region 310, an undercut layer 312, a waveguide core layer 314, and an upper cladding layer 318. The tunable section 300 further includes undercut access openings 306a-306h and legs 308a-308g. The tunable section 300 may include a p-type InGaAsP layer 320 provided on the upper cladding layer 318, and a p+ InGaAs contact layer 322 provided on the p-type InGaAsP layer 320 or directly on the InP cladding layer 318. As further shown in FIG. 3A, a first electrode 330 and a second electrode 332 are provided on the lower cladding layer 304. As an example, during the operation of the tunable section 300, a voltage (V) may be applied to the first electrode 330, and the second electrode 332 may be biased to ground. Accordingly, electrical currents 334 flow in parallel through each leg adjacent the first electrode 330, beneath the waveguide core layer 314, in parallel through each leg 308a-g adjacent the second electrode 332, and finally through the second electrode 332 to ground. The currents 334 are confined by electrical isolation trenches ("trench etch") 336 and 338. Lower cladding layer 304 is preferably a resistive n-type epitaxial layer. Accordingly, currents 334 may generate heat in the lower cladding layer 304, and such heat may be dissipated toward waveguide core layer 314. By adjusting the voltage applied to the first electrode 330, effective refractive index changes may be induced in the reflector, for example, and therefore an optical signal wavelength output from the laser may be tuned.

Figure 3B:
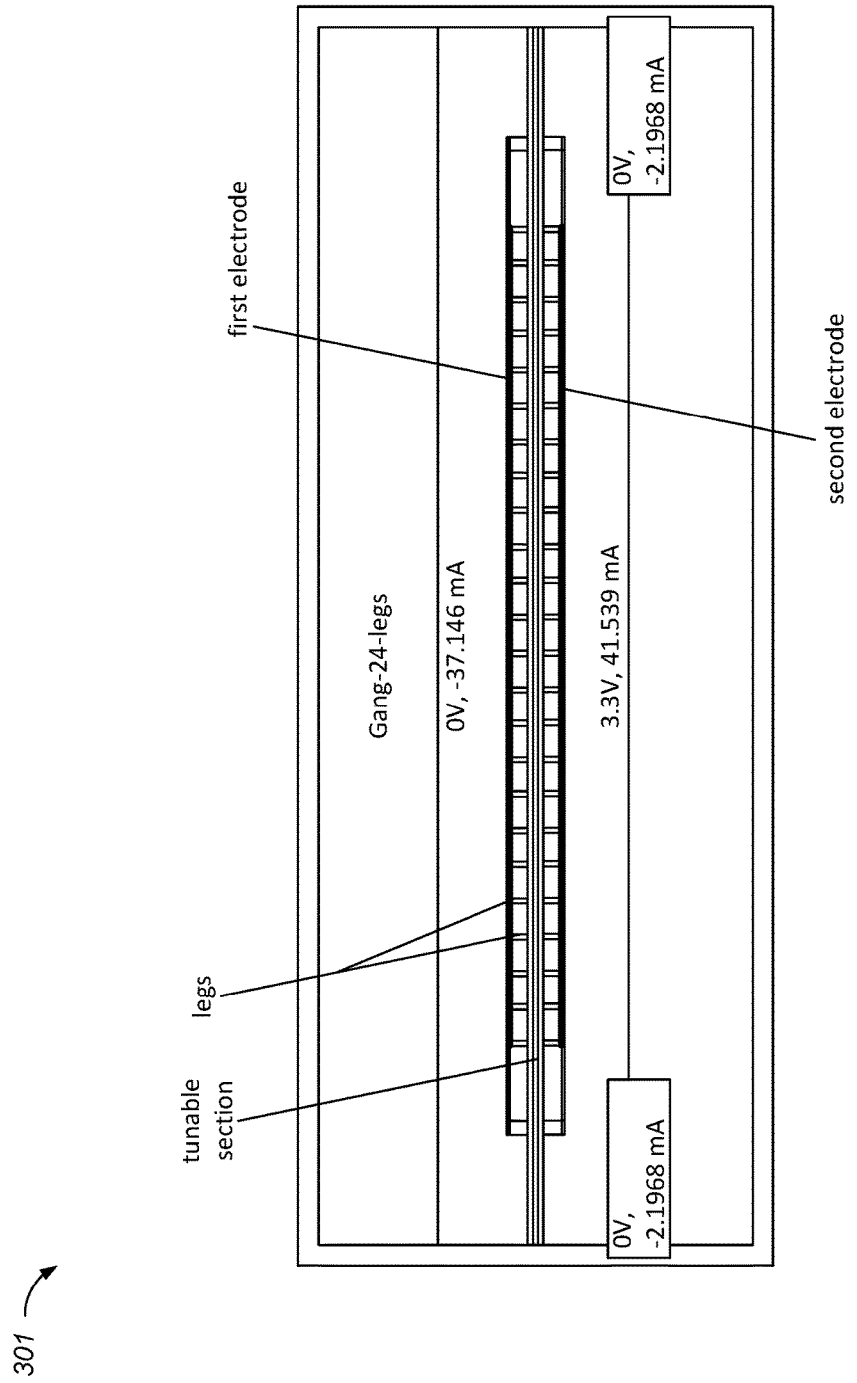

FIG. 3B illustrates examples of voltages and currents that may be applied to a tunable section 301 that is similar to the tunable section 300. In the example shown in FIG. 3B, the tunable section (including a mirror or phase section) includes 24 legs and first and second electrodes that extend parallel to each other on opposite sides of the tunable section. Each electrode may be continuous so that current flows through each leg in parallel. The legs are electrically ganged or connected to one another on a first side adjacent the first electrode and on a second side adjacent the second electrode. In this example, the legs are spaced from one another by a 25 µm pitch and each leg is 4 µm wide. The maximum temperature change is about 100° C., and the thermal resistance is about 730° C./W. The length of the tunable section is about 600 µm.

Figure 3C:
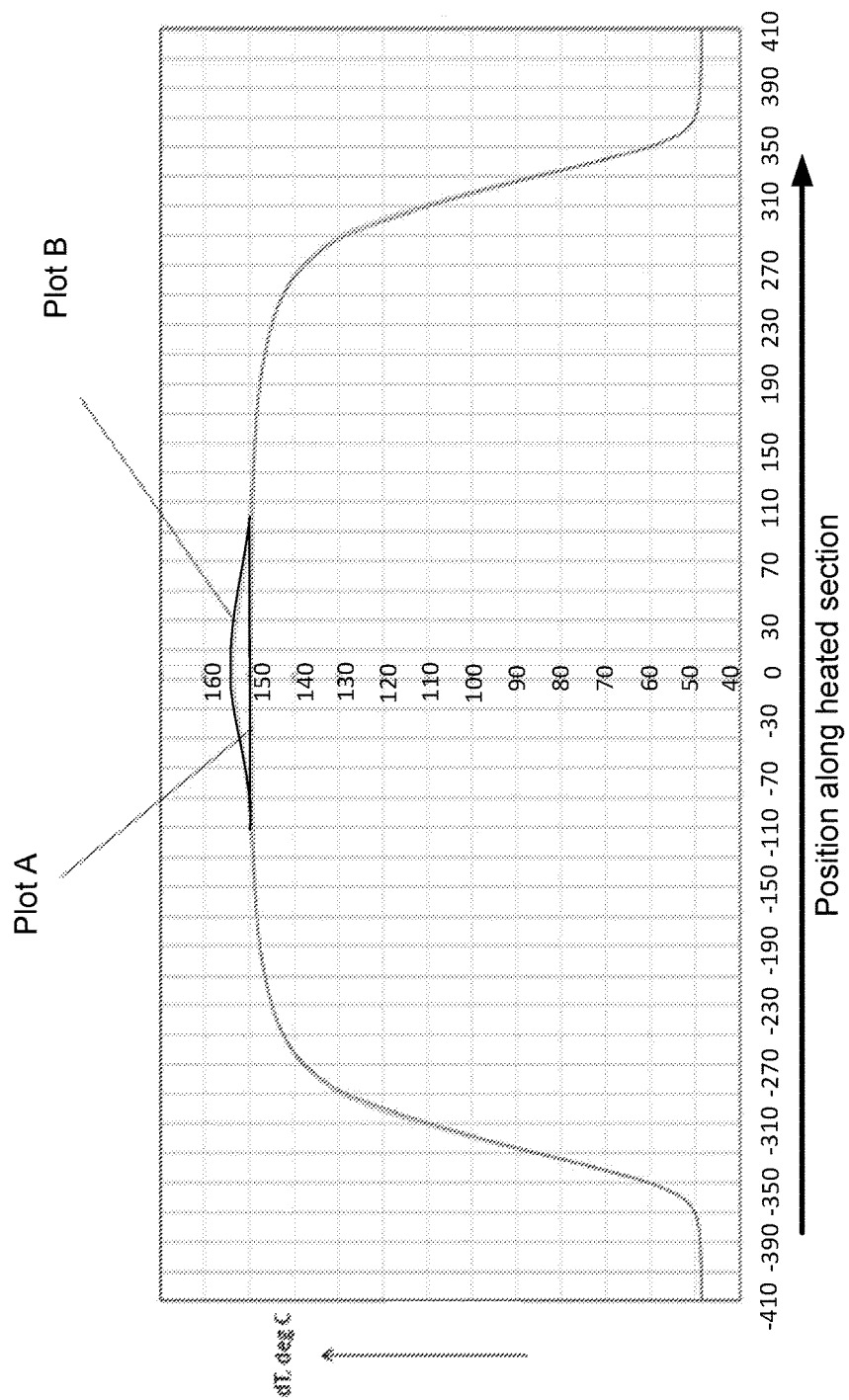

In some other implementations, the first and second electrodes may be configured, such that current flows in parallel through first and second groups of twelve legs each, and the first and second groups are connected in series. FIG. 3C shows temperature distribution plot A along the tunable section shown in FIG. 3B in which, as noted above, the current flows through all 24 legs parallel. FIG. 3C further shows temperature distribution plot B along a tunable section in which current flows though the series connected first and second groups of twelve legs each. As further shown in FIG. 3C, plot A is more uniform along the heated section, while plot B is less uniform and peaks substantially at the midpoint of the plot. Accordingly, choosing different leg widths and/or spacings near center of device may minimize temperature peak or dip at center of a tunable section.

Figure 4A:
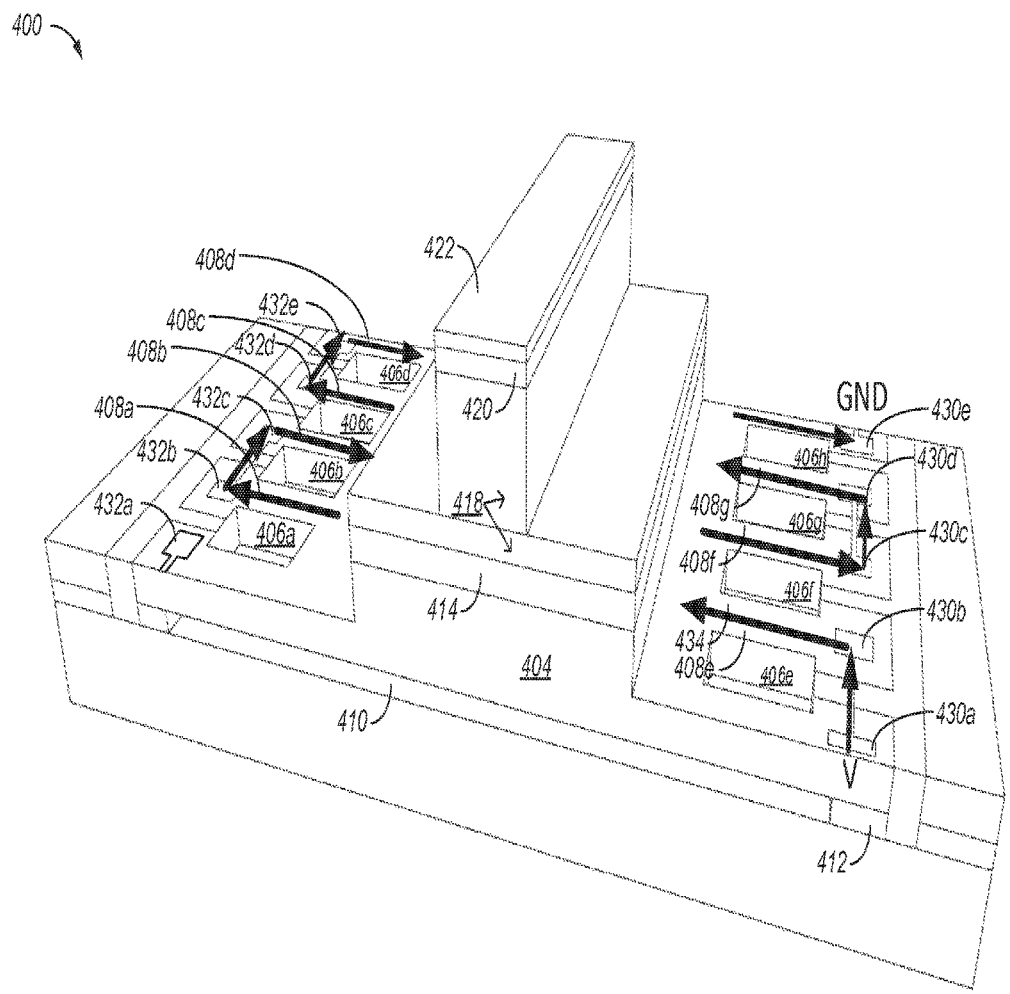
FIGS. 4A-4B illustrate an example tunable section for a tunable laser.

FIG. 4A illustrates another example tunable section 400 for a tunable laser. Similar to the elements as described in reference to FIG. 2A, the tunable section 400 includes a lower cladding layer 404, an undercut 410, an undercut layer 412, a waveguide core layer 414, and an upper cladding layer 418. The tunable section 400 further includes undercut access openings 406a-406h and legs 408a-408g. The tunable section 400 may include a p-type InGaAsP layer 420 provided on the upper cladding layer 418, and a p+ InGaAs contact layer 422 provided on the p-type InGaAsP layer 420 or directly on the InP layer 418. In this example, a first electrode and a second electrode are segmented into first electrode sections 430a-430g and second electrode sections 432a-432e. Each of the first electrode sections 430a-430e is electrically isolated from one another. Similarly, each of the second electrode sections 432a-432e is electrically isolated from each other. As a result, when a voltage is applied to one of the electrode sections, as further shown in FIG. 4A, current 434 flows through a corresponding one of the legs (e.g., 408e) adjacent to the first electrode section 430a-430m and through the lower cladding layer 404 (e.g., an n-epitaxial layer) to one of the legs (e.g., 408a) adjacent one of the second electrode sections 432a-432m. The current 434 next flows back through an adjacent leg (e.g., 408b) connected to the second electrode section and back to another one of the first electrode sections via the lower cladding layer 404. The current 434, therefore, may flow in a serpentine manner, as indicated by the arrows shown in FIG. 4A extending between the first and second electrode sections 430a-430m and 4302-432m, until the current sinks to ground.

Figure 4B:
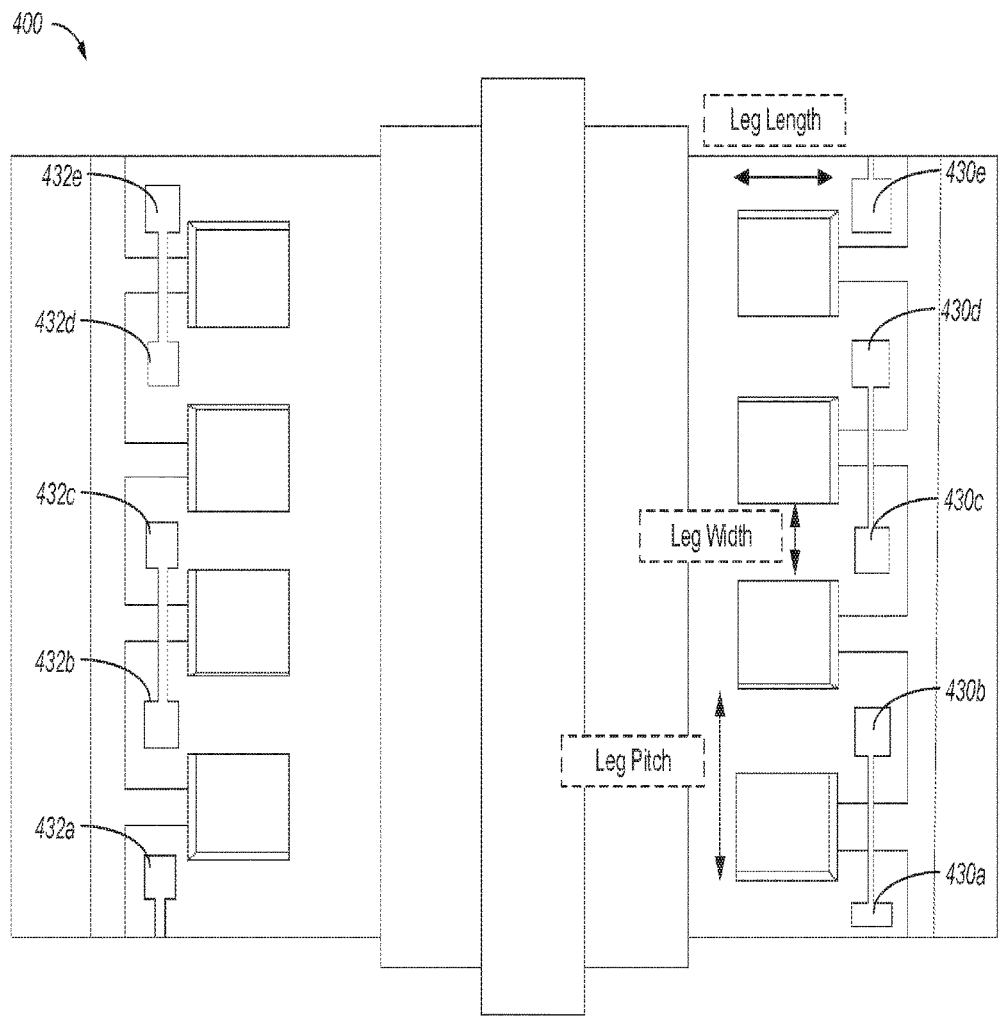

Referring to FIG. 4B, which shows a top view of the tunable section 400, the leg pitch may be 5-100 μm, the leg or arm width may be 1-30 μm, and leg length can be 2-50 μm, for example.

Figure 5:
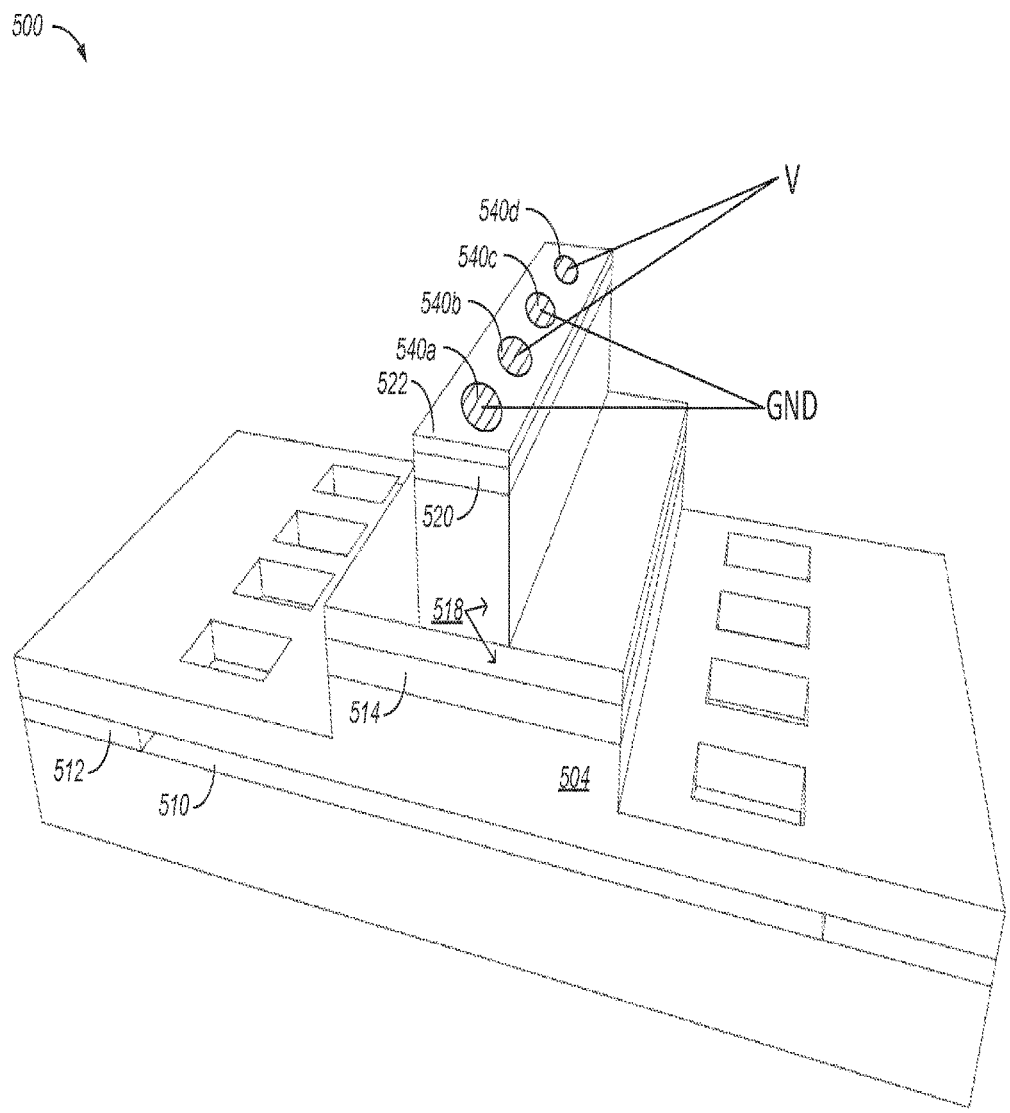
FIG. 5 illustrates an example tunable section for a tunable laser.

FIG. 5 illustrates another example tunable section 500, including a mirror or phase section of a tunable laser. Similar to the elements as described in reference to FIG. 2A, the tunable section 500 includes a lower cladding layer 504, an undercut 510, an undercut layer 512, a waveguide core layer 514, an upper cladding layer 518, a p-type InGaAsP layer 520 provided on the upper cladding layer 518, and a p+ InGaAs contact layer 522 provided on the p-type InGaAsP layer 520. Although the upper cladding layer 518 and the contact layer 522 are described as both being p-type, in some implementations, both may be n-type. In either case, the doped material may be relatively narrow and thin to be significantly resistive, such that simply running a current from one end of upper cladding layer 518 or contact layer 522 to the other would render voltage requirements impractical. Therefore, these layers, which may constitute a relatively long resistor, may be segmented into sections, which are driven in parallel (e.g. 10-20 sections run in parallel) to provide a significantly lower resistance. Current may also flow through the waveguide, including lower cladding 504, core 514, and upper cladding 518, in parallel with the current flow.

Moreover, in another example, the contact layer 522 may be replaced by another semiconductor material, such as amorphous silicon or polysilicon that is provided above upper cladding 518 and whose resistance may be adjusted by doping to achieve the appropriate resistance for heating and driving contact layer 522 with a desired power supply.

Preferably, P-type III-V material for the contact layer 522 is doped to have a concentration of $10^{18}$ to $10^{20}$ cm$^{-3}$ to provide suitable resistance, and the thickness may be in a range of 500-5000 Angstroms for processing convenience. P-type silicon or n-type III-V material (or silicon) can be doped to $10^{17}$ to $10^{20}$ cm$^{-3}$ and layer thickness may be within a range of 500-5000 Angstroms. The appropriate doping level and number of parallel electrodes used may be selected based on the length of the section to be heated, the resistance requirements of the circuit, thickness of the heater, mobility, and material limitations (e.g., doping concentration limit). As an example, the electrode may be in series or broken into up to 30 parallel sections. In some implementations, the electrodes may be connected by air bridges, as discussed in greater detail below with respect to FIG. 9A.

As further shown in FIG. 5, alternating first and second contacts, such as metal contacts 540a-540d, may be provided on the heavily doped semiconductor contact layer 522. The first contacts (e.g., 540b and 540d) may be biased to a desired voltage and the second contacts (e.g., 540a and 540c) may be biased to ground. The voltage may be selected such that a current flows away from each of the first contacts 540b and 540d and toward adjacent second (ground) contacts 540a and 540c in contact layer 522. Accordingly, a desired level of heat may be provided so that the tunable section 500 has a desired temperature that yields a selected wavelength of light output from the laser. Changing the voltage applied to the first contacts 540b and 540d, and thus the amount of current, as noted above, may result in corresponding changes in wavelength.

In the above examples, heaters may be provided either adjacent the gain or phase section of the laser. In addition, the gain and phase sections may be either deep etched (i.e., etched through the core layer) or shallow etched (i.e., does not etch through the core layer) as a "ridge" waveguide. In some implementations, the gain section is shallow etched because it is biased by current injection (i.e., current flows down the ridge). As a result, the etch does not go through the p-n or p-i-n junction, for improved reliability. The other sections may be shallow etched to provide less loss and back-reflection between sections within the laser, or may be deep etched for tighter optical and thermal confinement. In addition, the mirror waveguide may be flared to a width of 2-8 μm to enable lower resistance, more manufacturable heaters via contacts and heaters, as discussed in greater detail below with respect to FIGS. 19A and 19B The heater may be provided adjacent the gain section, either as a metal or semiconductor heater in a manner similar to that described above. By varying the temperature of the gain section, the phase of light of the laser cavity may be changed. Accordingly, by varying the phase by application of an appropriate temperature to the gain section, a separate phase section in the laser may be omitted, thereby simplifying device design and making the device more compact.

Regardless of the whether the gain section is tuned, the undercut preferably does not extend beneath the gain section, because the gain section is preferably thermally coupled to the substrate to ensure the lowest operating temperature for minimal Auger recombination loss, carrier leakage loss and for improved reliability. In this manner, the gain section, which may generate a significant amount of heat, can be adequately cooled by a heat sink, for example, that draws heat from the gain section through the substrate. On the other hand, the mirror sections and separate phase section(s) are typically passive elements tuned by heaters with relatively higher thermal resistance. Accordingly, the mirror and phase sections are preferably thermally decoupled from the substrate by the undercut layer in order to provide adequate wavelength tuning.

Consistent with the present disclosure, in some implementations, the reflector section and/or the phase section of a tunable laser may incorporate features that yield thermal uniformity in these sections. These features will next be described with reference to FIGS. 6A-6E and 7. In general, thermal uniformity is important for performance and reliability for thermally tuned lasers. Non-uniform thermal gradients along a reflector can cause thermal hot spots that degrade the reliability of the heaters. Moreover, non-uniform thermal gradients at the edge of mirrors can degrade the reflectivity spectrum leading to reduced performance, especially less stable laser wavelength control.

Figure 6A:
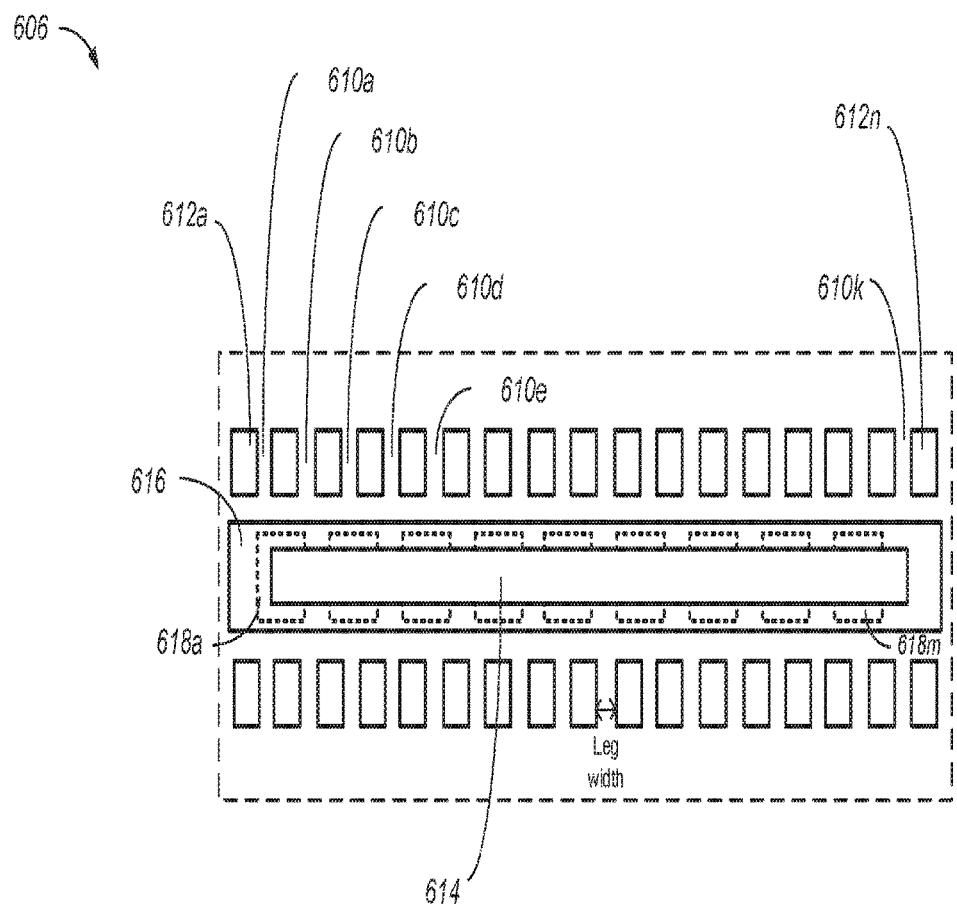
FIGS. 6A-6E illustrates an example tunable laser.

Thermal uniformity has predominant impact on the mirror and laser performance, whereas periodic thermal variations along the mirror negligibly degrade mirror reflectivity. Referring to FIG. 6A as an example, FIG. 6A illustrates a top view of a reflector 606. The reflector 606 includes n undercut access openings per side 612a-612n, k legs per side 610a-610k, a heater 614, and a waveguide 616, where n and k are positive integer numbers. m groups of gratings 618a-618m are formed on the waveguide 616, where the gratings have a designed grating burst pitch representing a fixed separation between adjacent grating group centers, and where m is a positive integer number. For example, the grating burst pitch may range from 65 μm to 75 μm to enable full C-band tunability.

Figure 6B:
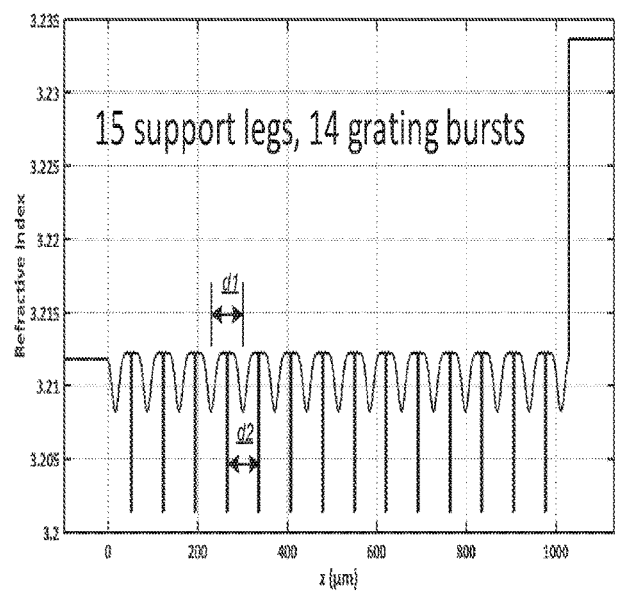
Figure 6C:
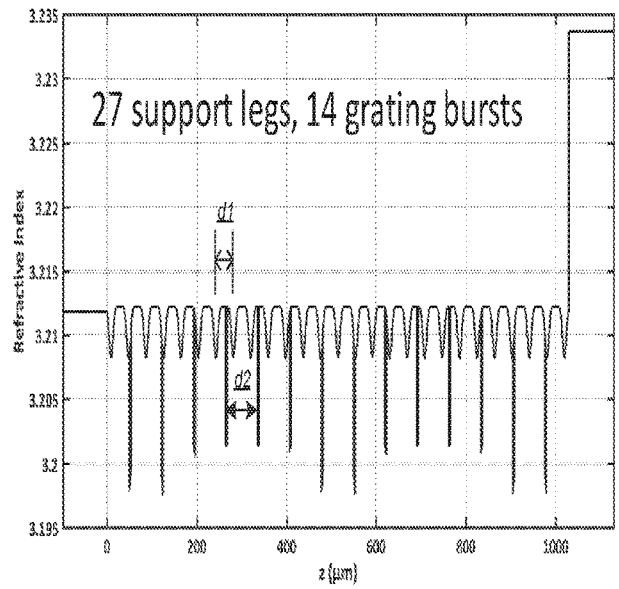
Figure 6D:
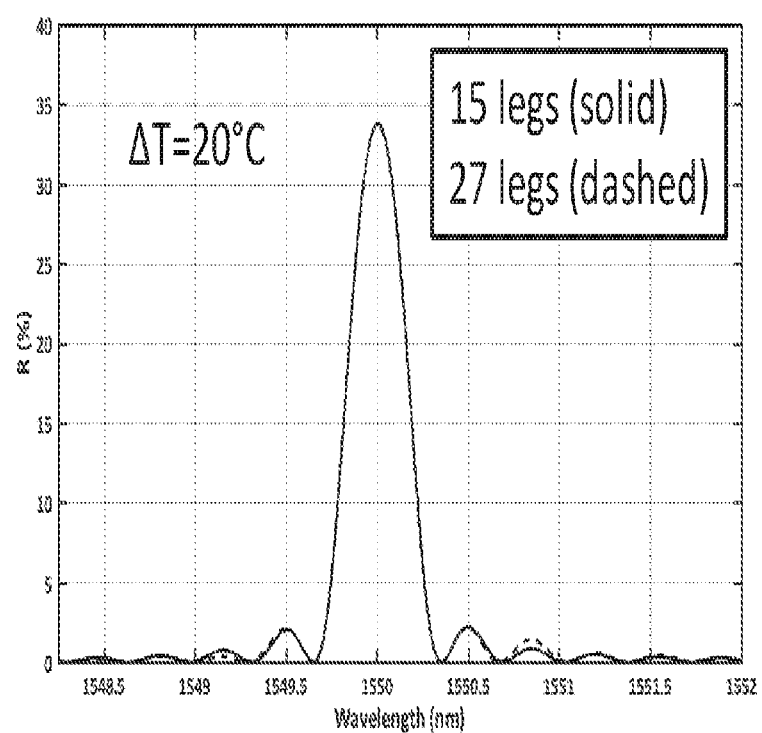

In some implementations, a pitch between adjacent legs may be designed to match the grating burst pitch. FIG. 6B shows a thermal profile 603 (where larger refractive index on the y-axis represents hotter temperature) of a reflector section (e.g., reflector 606) when the pitch between adjacent legs d1 is designed to match the grating burst pitch d2 by aligning the legs with the grating bursts. As shown in thermal profile 603, the temperature at locations along the waveguide adjacent the etch holes (e.g., the undercut access openings 612a-612n) may be greater ("hot") than the temperature at locations adjacent the legs (e.g., legs 610a-610k) ("cold"). In some implementations, a pitch between adjacent legs may be designed to mismatch the grating burst pitch. FIG. 6C shows a thermal profile 605 of a reflector section (e.g., reflector 606) when the pitch between adjacent legs d1 is designed to mismatch the grating burst pitch d2 by not aligning the legs with the grating bursts or any integer multiple or integer quotient thereof. FIG. 6D shows an example simulation 607 of reflectivity frequency responses for a reflector between the matched (solid line) and mismatched (dashed) cases. In this case, a temperature difference between the undercut access opening and the leg is 20° C. FIG. 6D shows negligible difference in mirror reflectivity spectrum between the two cases. For example, the support leg dip placement relative to grating burst location has very little impact on the mirror reflectivity peak and the full-width-half-maximum. Thus, it would be advantageous to design a reflector section having a uniform thermal profile at the edge of the mirror, instead of trying to maintain a thermal periodicity variation that aligns with grating bursts within the reflector section. For example, it may be desirable to achieve a temperature profile where the peak temperature is less than °10 C from the average temperature. Preferably, the peak temperature is less than °5 C from the average temperature.

Moreover, if the leg support design to the grating burst locations is constrained to grating burst pitch, it is not possible to optimize the mirror thermal and structural profile as effectively. By decoupling the grating burst pitch and the pitch of the legs, more flexible designs of the leg and undercut access opening placements is enabled. In some implementations, support leg pitch may be as much as a factor of two less than the grating burst pitch, when factoring in desired thermal resistance and structural support. For example, grating burst pitch may range from 65 to 75 μm to realize C-Band tunability. The pitch of legs may be less than 75 μm and preferably less than 50 μm. Nominal legs along optical axis (e.g., leg width as shown in FIG. 6A) may range in width from 2 to 12 μm, and preferably 3 to 7 μm.

Figure 6E:
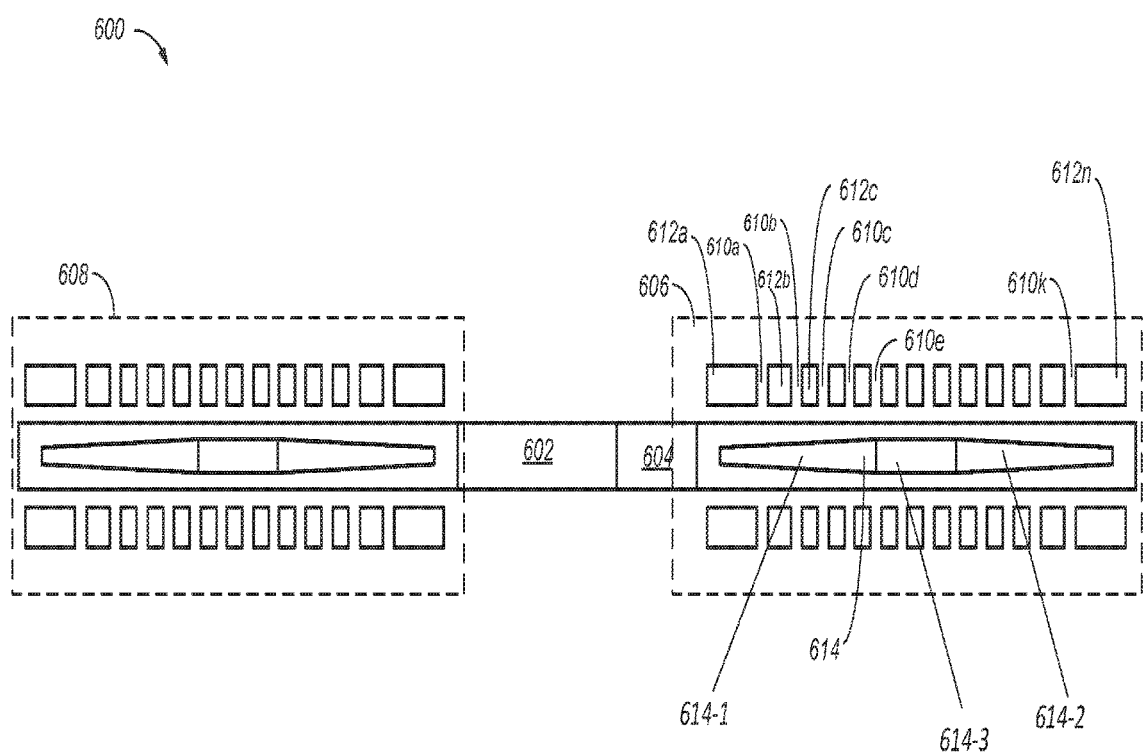
Figure 7:
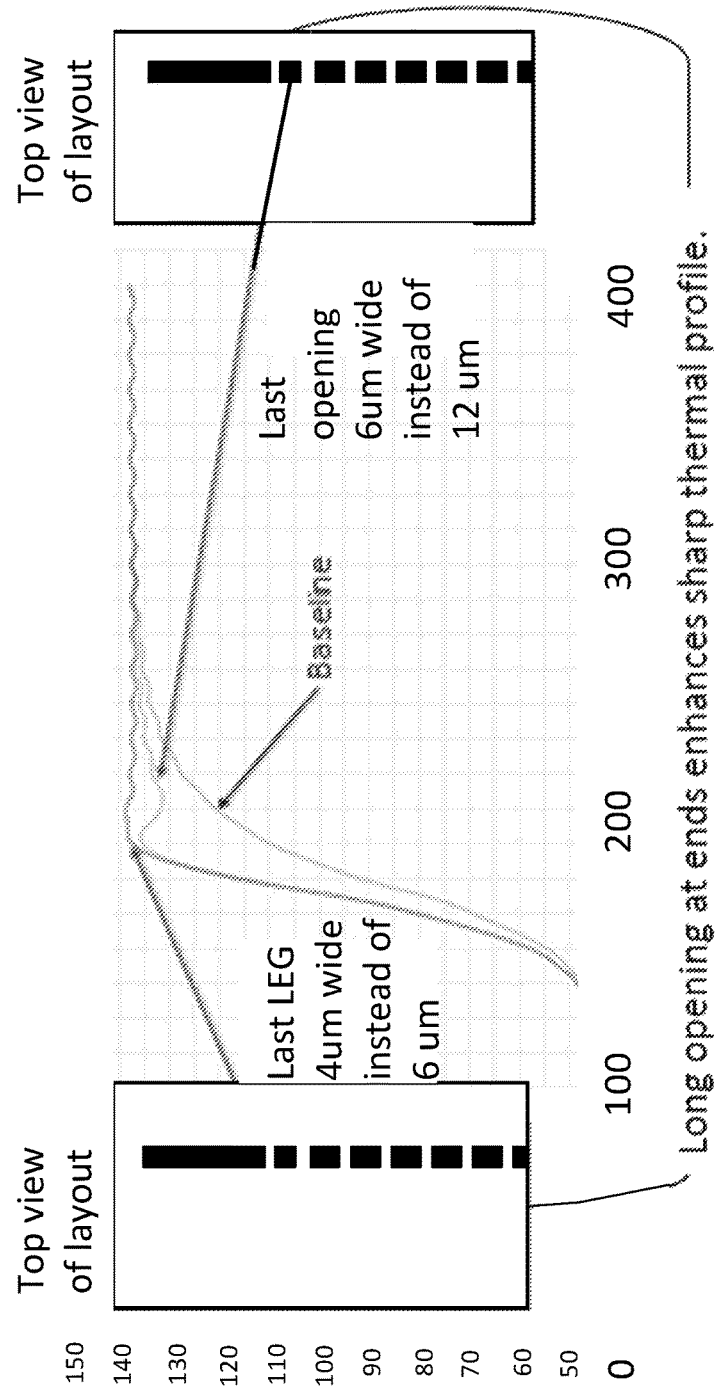
FIG. 7 is a plot of an example temperature distribution along a tunable section of a tunable laser.

At the mirror edges, it is advantageous to have the freedom to vary the outer one, two, or more window openings to peak the thermal resistance, compensate heat flow to the non-undercut ends of the waveguide, and to optimize the stepped ΔT profile. FIG. 6E illustrates a top view of an example tunable laser 600. The tunable laser 600 includes a gain section 602, a phase section 604, a first reflector section 606, and a second reflector section 608. The first reflector section 606 and the second reflector section 608 may be implemented using any tunable section as described in reference to FIG. 1 to FIG. 5 above. In some implementations, the width and/or spacing of the legs may be selected to provide a substantially uniform temperature distribution along the length of the tunable mirror section or purposely tune the temperature profile along the length of the laser. For example, the first reflector section 606 may include legs 610a, 610b, 610c, 610d, and 610e. The spacing between the legs (e.g., 610a, 610b, and 610c) closest to the ends of a tunable laser section may be greater than the spacing between remaining legs (e.g., 610d and 610e) of the tunable laser section.

Additionally, the distance along the waveguide required to transition between the uniformly hot portion of the heated section to the next portion of the waveguide, such as the gain section 602 or the phase section 604, is preferably minimized in many cases in order to minimize an effective index change between a heated section (e.g., the second reflector section 608) and a gain section (e.g., the gain section 602). As a result, the heat required for a given amount of tuning can be minimized or reduced, as well as the distance between reflectors in the laser cavity. As an example, to minimize the length of the thermal gradient or transition region, the spacing between the first ~100 μm, or first through fourth pairs of legs closest to the ends of the tunable laser section, may be greater than the spacing between remaining legs of the tunable laser section. Such spacings may result in a thermal gradient similar to that shown in FIG. 7 between hot and cold locations, in which the gradient portion of the plot is relatively sharp and short in length and shows a temperature change of more than 90 degrees C. over 50 μm as opposed to over 100 μm in a laser consistent with the present disclosure. Another method to minimize the thermal gradient is to use narrower legs in the first 100 μm or first four leg pairs at the ends of the heated sections. The mirror gratings, for example, may not be accurately tuned if formed in material having a net sloped thermal gradient. Thus, a sharp, but short, thermal gradient, can reduce the cavity length, resulting in a more compact laser design. As an example, the width of the opening 612a may be designed to be between 30 to 45 µm, the width of the opening 612b may be designed to be between 10 to 20 µm, when the width of the opening 612c is designed to be 10 µm, and all widths scaled accordingly as the width of opening 612c is varied from 10 um.

Moreover, a sharp gradient can minimize temperature increases in the gain region resulting from the heated mirror and phase sections. The sharp gradient also minimizes the heat required to tune the waveguide mirror. Generally, heating the gain section causes reduced reliability and reduced performance due to hot spots and reduced quantum efficiency. Accordingly, the gain section is typically not heated over a wide temperature range, but may be tuned over a small range for phase control.

Returning to FIG. 6E, in some implementations, a heater 614 (e.g., the heater 224 from FIG. 2A) may be tapered toward heater ends 614-1 and 614-2, such that a middle section (614-3) of each heater is wider than the end portions. For example, the heater may be tapered or stepped over a length of 10 to 150 µm. As a result, more heat may be dissipated at the ends so that the heater may have a more uniform temperature over a larger portion of the heater. Also, the heater may be made more compact to enable the laser cavity to be shorter or else the gain section may be made longer for the same cavity length. The tapered sections of the heater may be linear (as shown), sub-linear or super-linear. Multiple tapers may be employed in the heater geometry, including those over the mirror portion as shown, as well as additional tapers to allow larger landings for contact vias beyond the ends of the mirrors.

Excessive thermal resistance in the mirror section (as measured per length of the heated mirror section) can destabilize the wavelength tuning of the laser. For example, stable wavelength tuning has been observed for ratios of the thermal resistance (C.°/W) to heated mirror length (µm) that is less than about 1.3 C.°/W/µm. However, removing the contact layers allows the design to exceed this empirical limit by reducing optical absorption in those layers, and is described in more detail with reference to FIGS. 9A-9C.

Figure 8:
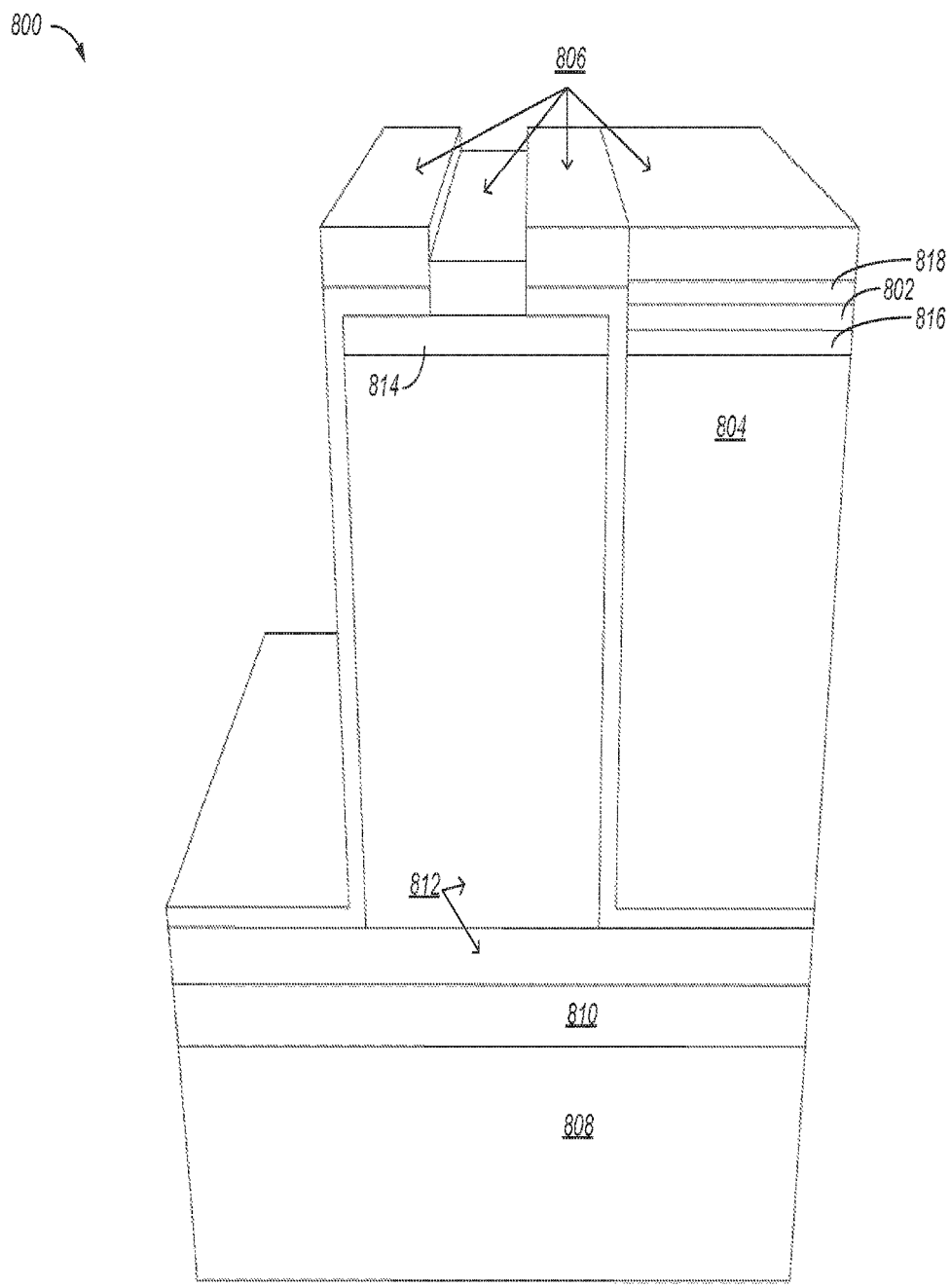

FIGS. 8 and 9A-9C show examples of heater placement adjacent to a gain section 800, which serves as a phase tuning element. In FIG. 8, a heater 802, which may include tungsten, for example, is provided in or above a planarization dielectric 804 (e.g., a layer of bisbenzocyclobutene ("BCB")), and an electrode 806 that supplies current to the gain section overlies the BCB layer 804 and contacts gain section 800, which may include a lower cladding layer 808, a waveguide core layer 810, an upper cladding layer 812, and a contact layer 814. In some implementations, if reactive materials are employed or if necessary for adhesion, the heater 802 may be encapsulated in dielectric layers 816 and 818 (e.g., SiN, SiOxNy, SiOx or combinations thereof).

Figure 9A:
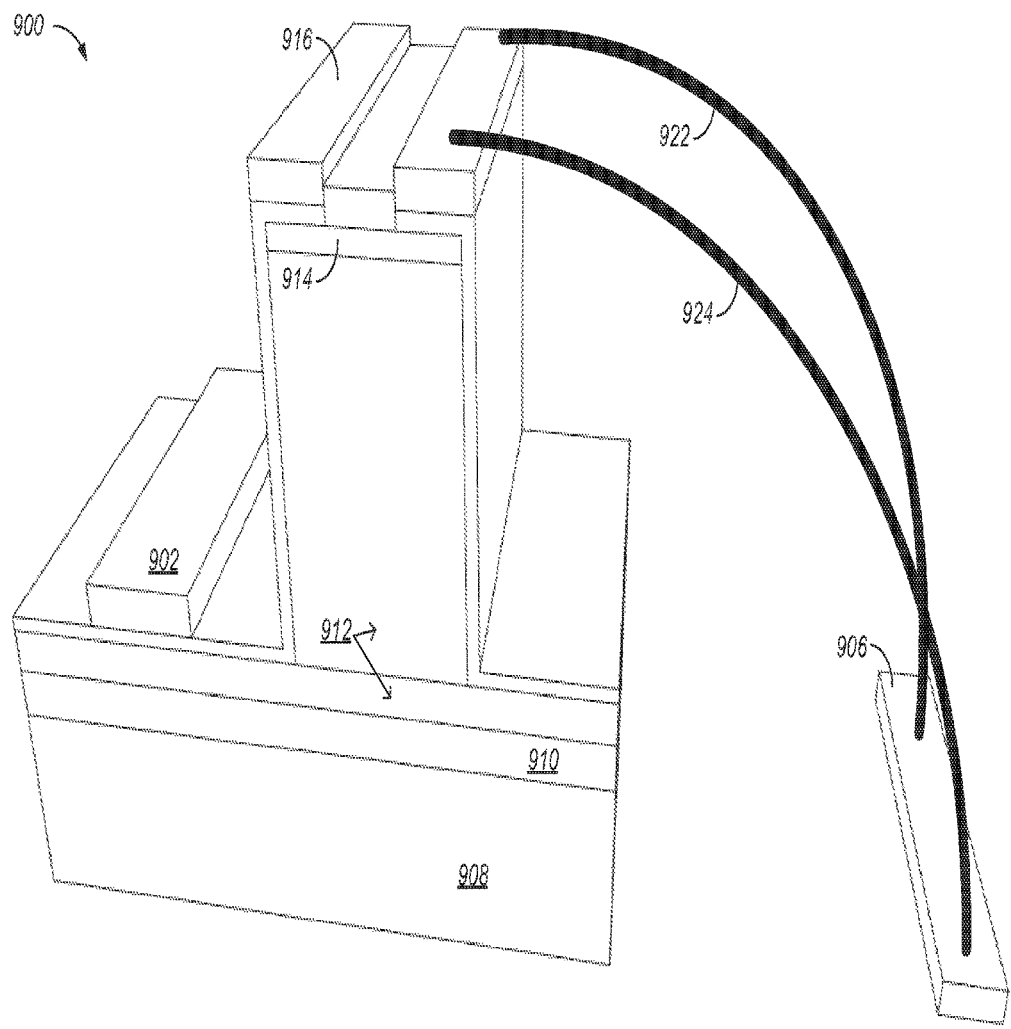

FIG. 9A shows an example arrangement a gain section 900, where the planarization material (e.g., BCB) is removed or omitted to reduce stress and/or stress changes over life of a laser. In the example shown in FIG. 9A, a heater 902, including platinum and/or tungsten is provided on a side of the gain section 900 opposite to where the current carrying electrodes 922 and 924 (e.g., leads or wires) are provided. The current carrying electrodes 922 and 924 are shorted using an isolated metal strip 906 that is formed using a metallization step that is different from the metallization step that forms the electrodes 916, 922, and 924. The gain section 900 may include a lower cladding layer 908, a waveguide core layer 910, an upper cladding layer 912, a contact layer 914, and an electrode 916. In FIG. 9A, the planarization material (e.g., BCB) is removed or omitted using a metal air-bridge process. A conventional metal air-bridge process uses photoresist or other dissolvable organic material to define the bottom of the metal path between at least two different landing or contact areas so that a combination of metal evaporation, sputtering or electroplating initiates and builds up the metal bridge to a desired thickness and in the desired location. After dissolution of the organic material, the metal connection or bridge between the two or more contacts is free-standing over a range of topography including trenches, flat surfaces and sometimes higher features. As noted above, the undercut section does not extend beneath the gain section. Further, BCB may be removed along the heater and phase sections, but typically not adjacent to the gain section.

FIG. 9B illustrates a simplified plan view of an example laser 901 including reflector 932 and 934, a phase section 936, and a gain section 938, whereby the planarization material (e.g., BCB) is removed or cleared adjacent the gain section 938. FIG. 9C illustrates an example of a laser 903 similar to that shown in FIG. 9B, including reflector 942 and 944, a phase section 946, and a gain section 948, but with the planarization material (BCB) adjacent the gain section 948.

If a phase section is included, the undercut portion, as shown in FIG. 2A, may or may not extend beneath such phase section depending on the length of the phase section and the thermal budget of the laser. Accordingly, thermal decoupling of the phase tuning sections from the substrate may or may not be required.

Figure 10:
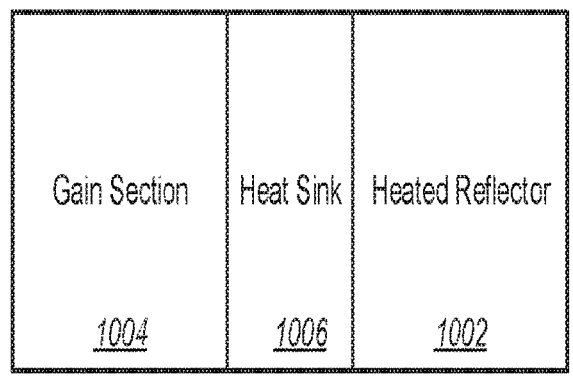
FIG. 10 illustrates an example arrangement of a tunable laser.

Preferably, the gain section, is thermally isolated from other heated sections, such as the mirrors. FIG. 10 illustrates an example arrangement 1000 of a tunable laser including a heated reflector 1002 and a gain section 1004. As shown in FIG. 10, a layer 1006 including a heat sink metal, for example, may be provided between the reflector 1002 and the gain section 1004 that extends to the substrate as a "cold finger." Alternatively, other materials may be used as a "cold finger". Further, other devices may be used to thermally isolate the gain section, such as a heat sink. The cold finger may be made of gold and may have a width in a range of 1-50 µm and a thickness in a range of 1-10 µm. Preferably, the dimensions of the gold finger are such that the gold finger does not interact with an optical mode propagating in the waveguide.

Figure 11:
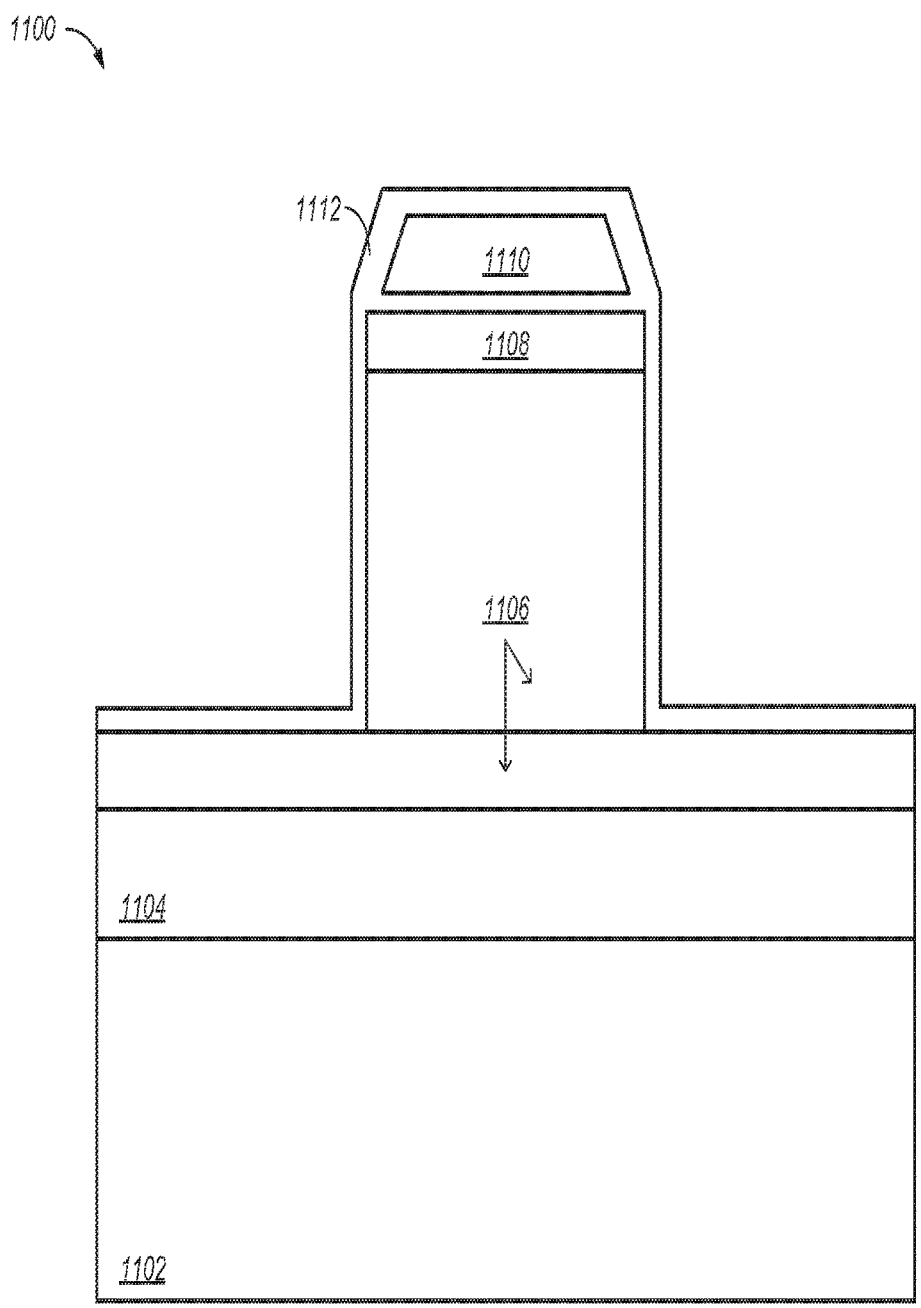
FIG. 11 illustrates a cross-sectional view of a tunable laser.

FIG. 11 illustrates a cross-sectional view of a tunable laser 1100. The tunable laser 1100 includes a lower cladding layer 1102, a waveguide core layer 1104, an upper cladding layer 1106, a contact layer 1108, and a heater 1110. In this example, the heater 1110 may be provided on the waveguide upper cladding 1106, including InP, for example. The heater 1110 may include one or more of the following materials: Ta, $WN_x$, W, TaN, Cu, Al, WSi, WNSi. W or $WN_x$ or WNSi is potentially preferred for InP as it has a nearly matched coefficient of thermal expansion (CTE) to minimize stress on the heater 1110. In some implementations, if the heater material is reactive, e.g., the heater 1110 is made of tungsten (W), the heater 1110 may be fabricated with a vertical or positive side slopes, and may be fully encapsulated in a dielectric 1112, such as SiN, SiON, or SiO2 as all or parts of the encapsulation layer 1112. These encapsulation layers 1112 are preferably sufficiently thin to not add additional stress, but sufficiently thick to provide environmental sealing. For example, the minimum thickness of the encapsulation layers 1112 may be 0.5 μm. Typically, the heater 1110 may constitute a strip of metal, and the coefficient of thermal expansion (CTE) of the heater 1110 and the encapsulating dielectric 1112 is selected to reduce stress. Although not shown in FIG. 11, in some implementations, an undercut may be formed under the lower cladding layer 1102 as described in reference to FIG. 2A.

Figure 12:
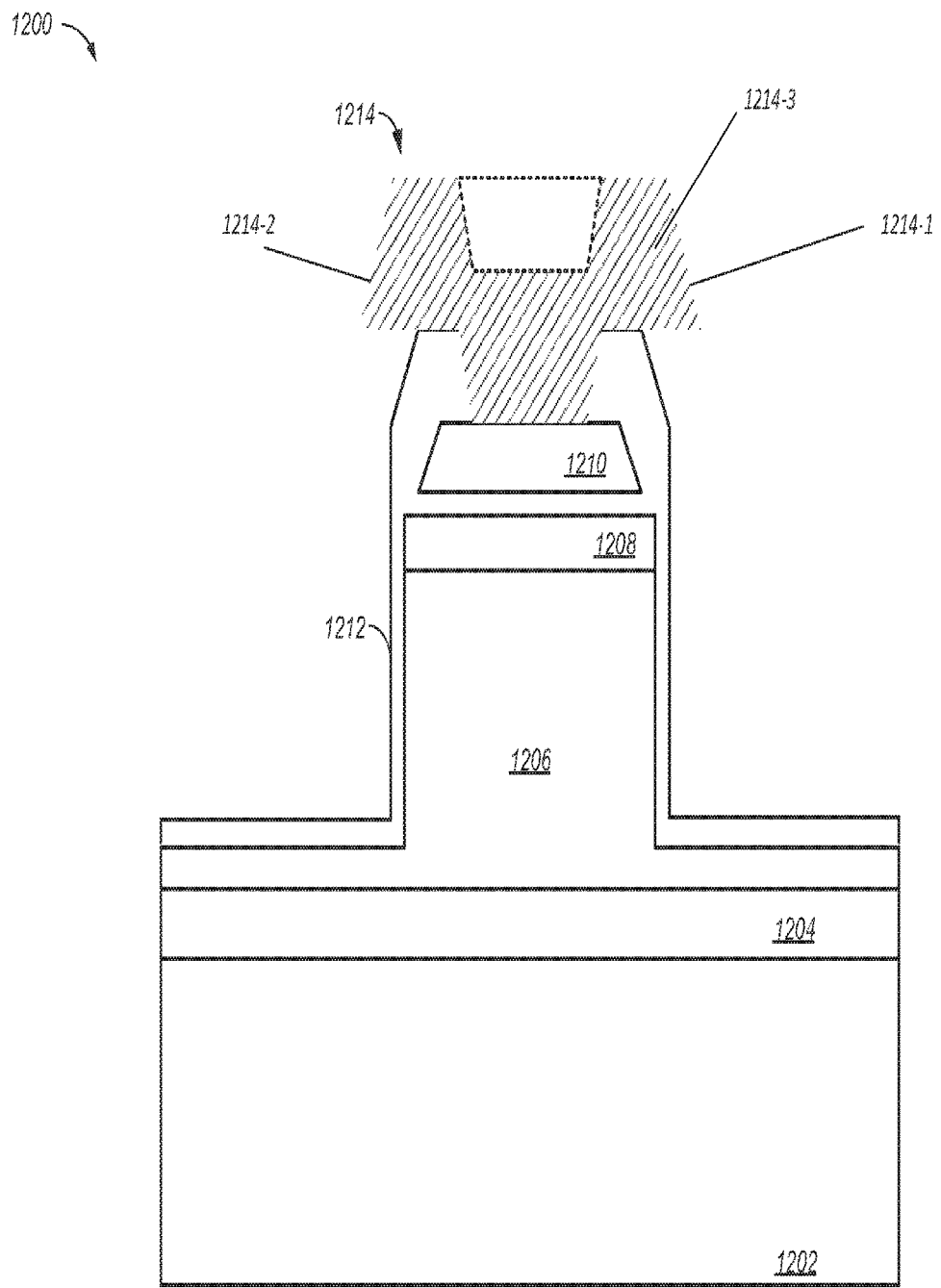
FIG. 12 illustrates a cross-sectional view of a tunable laser.

FIG. 12 illustrates a cross-sectional view of a tunable laser 1200. The tunable laser 1200 includes a lower cladding layer 1202, a waveguide core layer 1204, an upper cladding layer 1206, a contact layer 1208, a heater 1210, and optionally a dielectric 1212. As shown in FIG. 12, a top portion of the heater 1210 is exposed such that a "landed via" 1214 can be provided that contacts the heater 1210. In some implementations, the landed via 1214 has positive slide slopes 1214-1 and 1214-2 to ensure that a metal sealed contact 1214-3 does not run over the sides of the waveguide. Although not shown in FIG. 12, in some implementations, an undercut may be formed under the lower cladding layer 1202 as described in reference to FIG. 2A.

Figure 13A:
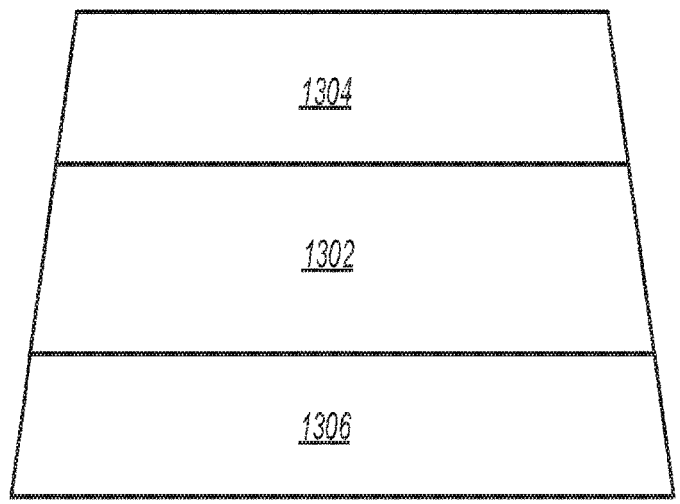
FIGS. 13A and 13B illustrate cross-sectional views of a heater consistent with the present disclosure.
Figure 13B:
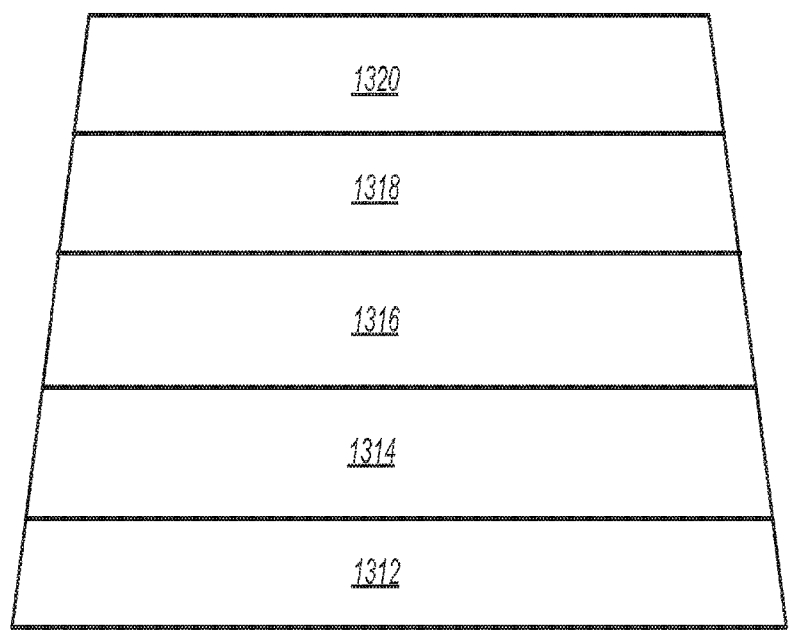

In some implementations, the heater may include a stacked structure including alternating layers of different metals. Referring to FIG. 13a as an example, a stacked heater 1300 including a layer of platinum 1302 provided between two layers of titanium 1304 and 1306 has been found to have better adhesion than other heater materials. In another example shown in FIG. 13b, a stacked heater 1310 may include alternating first (1312, 1316, 1320) and second (1314 and 1380) layers, wherein the first layers (1312, 1316, 1320) include a metal, for example, having a coefficient of thermal expansion ("CTE") less than that of the substrate and the second layers (1314 and 1380) include a metal, for example, having a CTE greater than that of the substrate or vice versa. As a result, the stacked heater 1310 may be stress-balanced, such that the overall stress is reduced to prevent delamination. Preferably, differences in CTE are not be greater than 5 ppm/C—between dielectric and semiconductor or between heater metal and semiconductor. The stacked heater 1310 may be used in any one of the tunable sections described in this disclosure, or any other thermal-controlled optical devices.

A reflector may be controlled to change the operating wavelength of the laser over a wide range. In order to insure such tunability, a reflector is preferably designed to have a reflection spectrum that is shaped to provide maximum reflectance at a desired wavelength or comb of wavelengths. Any distortion relative to such design can degrade laser parameters such as the side mode suppression ratio (a ratio of the amplitude of the main mode to the largest side mode), laser threshold and optical linewidth. Such distortions can be minimized by reducing optical absorption in the reflector.

Because the optical field intensity is high inside a laser cavity, a relatively small amount of optical absorption in a reflector can lead to significant distortions in the reflection spectra. For example, optical absorption can induce distortions by non-uniformly changing the material refractive index along the length of a reflector waveguide section. In particular, such refractive index changes may result from non-uniform thermal heating in the reflector waveguide due to the optical energy absorbed by the material. In addition, refractive index changes can be caused by photo-carrier generation due to optical absorption and subsequent carrier accumulation in low bandgap material layers of the reflector. In the presence of high electric fields, which may be found in the mirror, non-linear phenomena, such as two-photon absorption ("TPA"), may cause further absorption. Moreover, hot-carrier accumulation in passive semiconductor material layers of the mirror can enhance optical absorption due to a greater interaction cross-section for hot carriers.

Consistent with the present disclosure, in some implementations, the reflector section of a tunable laser may incorporate features that reduce absorption. These features will next be described with reference to FIGS. 14A-14D, 15A, 15B, and 16-18.

Figure 20:
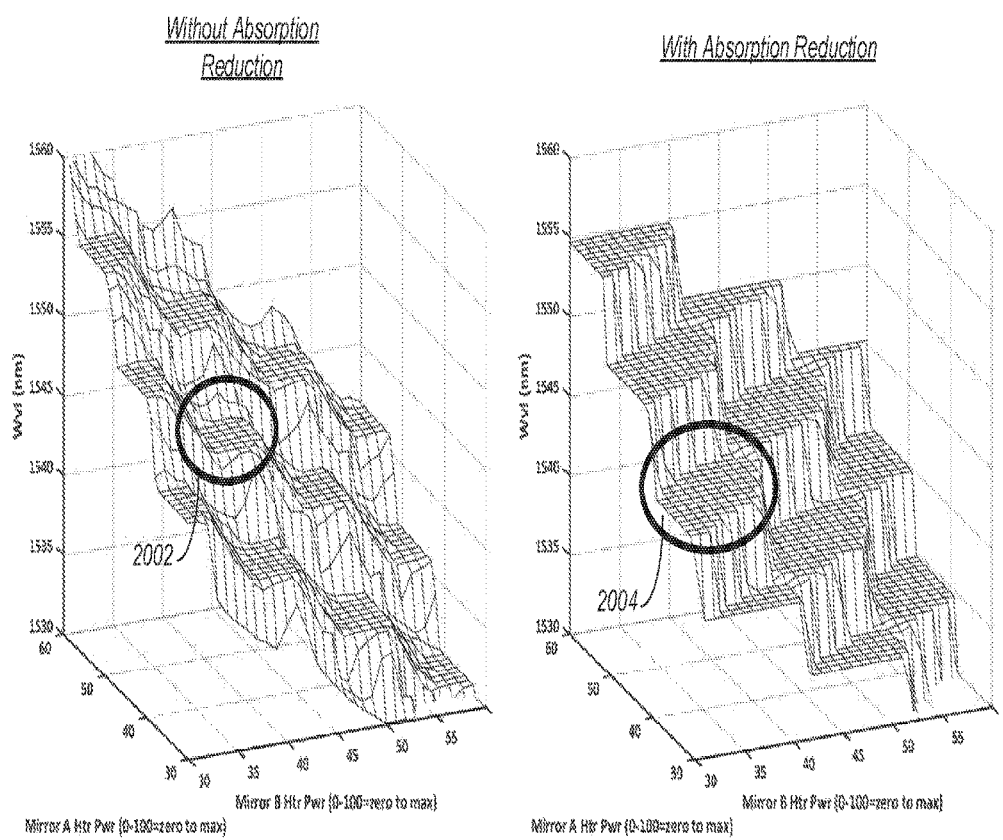
FIG. 20 illustrates a comparison of operable regions for a wavelength tunable laser with and without absorption reduction.

In general, a wavelength tunable laser (WTL) requires doping and contacting schemes in the gain section of the laser. This requirement, along with practical integration schemes for tunable mirrors and tunable phase sections, means that some or all doping and contacting layers are often present in the mirror and/or phase tuning sections of the WTL. If optical absorption is high, self-heating would occur, which may affect the grating stability, especially for mirrors with high thermal resistance values (>200° C./W, and especially >500° C./W undercut sections for example). An important consideration for the design of a stable device is to have sufficiently low optical absorption in the undercut sections, to ensure that self-heating does not occur within these sections in the cavity. In the absence of sufficiently low absorption in the undercut sections, the tuning characteristics and stability of the laser are significantly affected. As an example, FIG. 20 shows a comparison of operable regions for a WTL with and without absorption reduction in the undercut layers. The horizontal axes represent the power that is applied to the two tunable mirror heaters. The vertical axis represents the operating wavelength for given applied powers. The flat region, e.g., region 2002 or 2004, is a usable region for a WTL. Outside of these flat island regions, the WTL would exhibit unusable multimode behavior. By reducing the absorption in the mirror sections, the usable region 2004 is notably larger than the usable region 2002, which enhances device stability and reduces the control requirements placed on the laser.

Moreover, while the undercut regions inherently do not absorb light, the rest of the PIC may contain a non-undercut layer, and the design should be such that absorption over the gain section and for the propagation length of the chip is minimized to less than 1 dB/cm or less than 3 dB for most practical circuits. Additionally, the contact layer especially in the undercut elements should be minimized to less than 1 dB/cm to avoid localized heating and distortion of the mirror reflectance properties. A thermal gradient of more than 20° C. owing to absorption by the contact can noticeably degrade the reflector characteristics, and the amount of absorption required to produce such a gradient is a function of the laser design as well as the thermal resistance per length of the undercut reflector. Failure to adequately eliminate contact absorption and reflector distortion can result in laser tuning characteristics that have hysteresis and therefore poor control of the laser wavelength. Elimination of the contact layer by design or by process over the reflectors is the most robust way to ensure that adverse effects of absorption-induced distortion are avoided. It is also advantageous to minimize loss and convenient to remove the contact layer wherever possible from routing waveguides, couplers and separate phase-tuning sections if such an elements are employed in the laser or in the circuit.

Figure 14A:
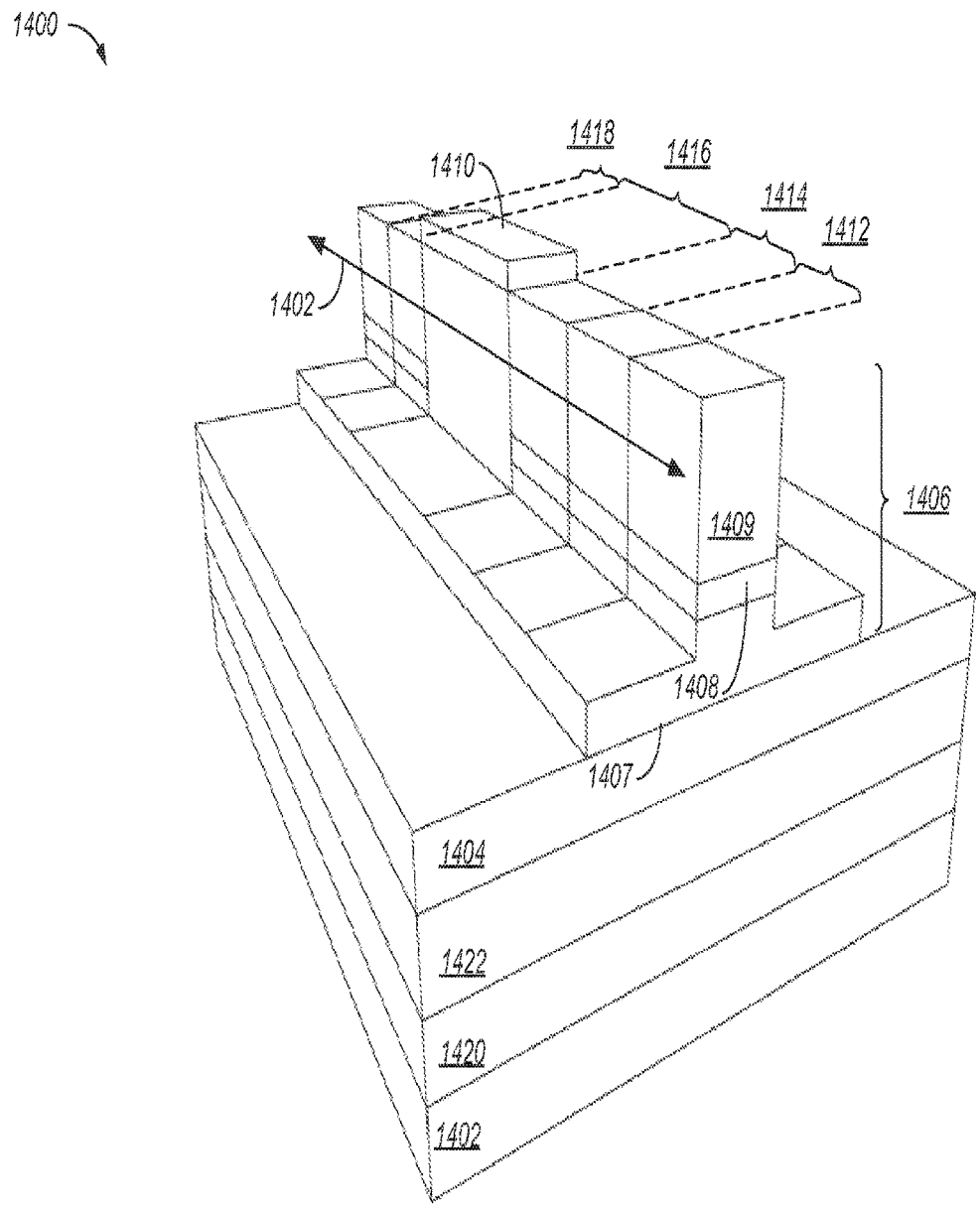
FIGS. 14A-14D illustrate an example tunable laser.
Figure 14B:
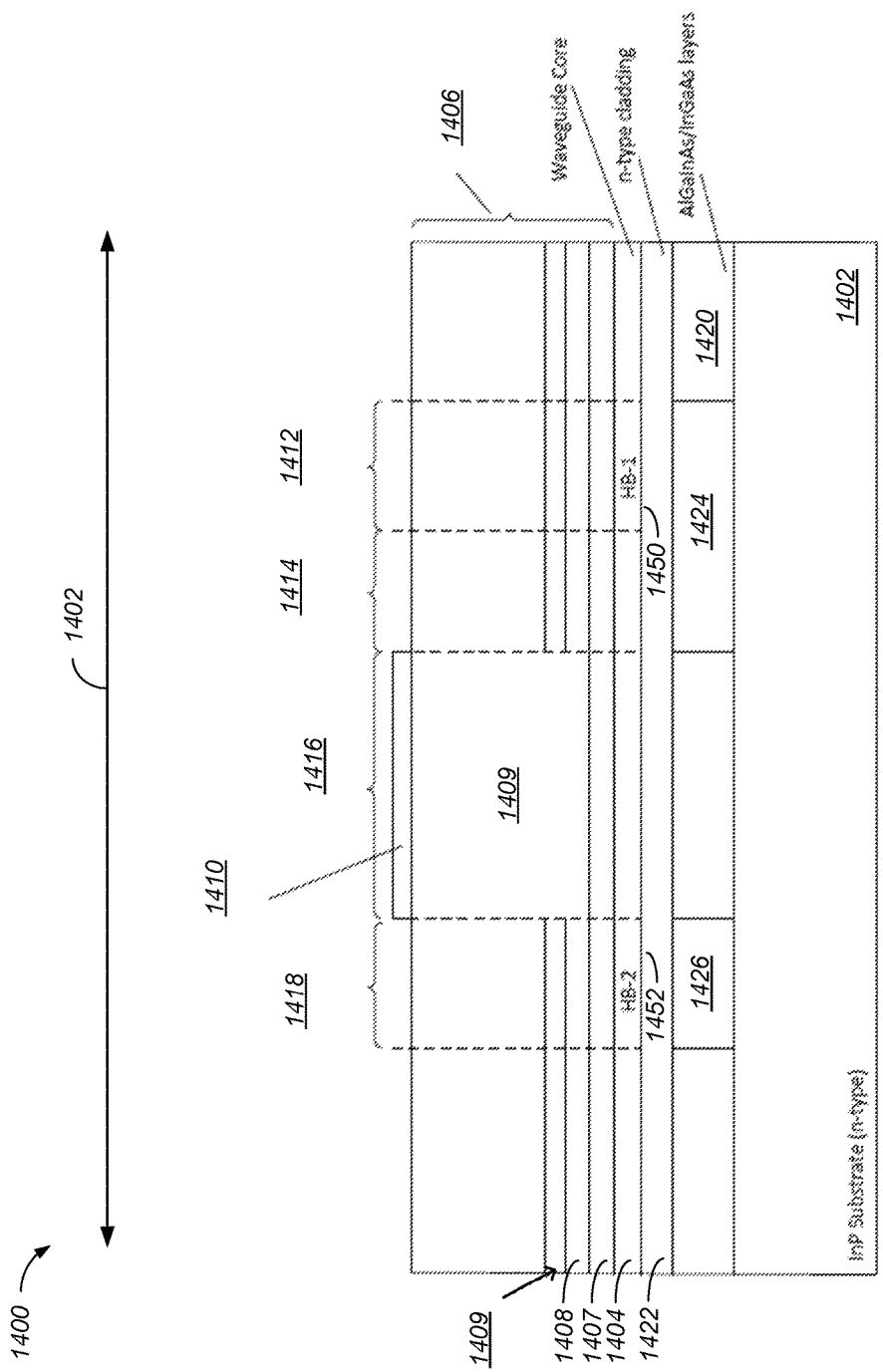

As discussed below, there are various ways for achieving sufficiently low-absorption in mirrors and phase sections that are undercut. For purposes of this invention, we define a "low loss undercut section" to have a total modal loss less than 2.5 dB/cm, less than 5 dB/cm, or less than 7 dB/cm depending on the design requirements. Accordingly, a WTL that has a low loss undercut section is a laser where the reflector section with a modal loss in that section that is less than 2.5 dB/cm, 5 dB/cm, or 7 dB/cm. If the WTL has an undercut phase section, it may also be desirable to have that undercut section be a low loss undercut section. In some implementations, this may be achieved by removing absorbing contact layers from undercut sections. Absorbing layers for purposes of this patent are layers where bandgap wavelength is longer than the operating wavelength of laser. A deleterious device layer is a contact layer or other layer within the device outside the waveguide core which absorbs the optical power from a propagating signal to cause a modal loss that is higher than a desirable loss, e.g., 2.5 dB/cm, 5 dB/cm, or 7 dB/cm. The deleterious device layer may be a p-type or an n-type layer. FIG. 14A shows an example tunable laser 1400 provided on substrate 1402, and FIG. 14B shows a side view of laser 1400 taken along a direction indicated by an arrow 1402. Both figures may be referred to in the following text. In this example, the tunable laser 1400 includes an n-type InP substrate 1402. Other substrate types may be suitable. An undercut layer 1420 is formed on the substrate 1402, and a lower cladding layer 1422 is formed on the undercut layer 1420. A waveguide core layer 1404 is formed on the lower cladding layer 1422. An upper cladding layer 1406 including a p-type layer 1407, an n-type layer 1408, and a p-type layer 1409 is provided on the waveguide core layer 1404. The tunable laser 1400 further includes a p+ contact layer 1410, as described in greater detail below, that may be provided on selected portions of the p-type cladding layer. The tunable laser 1400 includes a first reflector section 1412, a phase section 1414, a gain section 1416, and a second reflector section 1418. Other layers or structures, such as a dielectric encapsulation and a metal strip heater for thermal heating, may be included in the tunable laser 1400 but are not shown for ease of explanation.

The p+ contact layer 1410, which may include Indium Gallium Arsenide (InGaAs) or another narrow bandgap material, for example, may be provided or deposited on the gain section 1416 of the tunable laser 1400, but not on the reflector sections 1412 and 1418 and phase section 1414. In one example, the p+ contact layer 1410 may be first deposited on and is then etched over reflection sections 1412 and 1418, as well as the phase section 1414, to expose portions of the upper cladding 1409 corresponding to these sections.

The p+ contact layer 1410 typically includes a narrow bandgap material. The high doping concentration and low bandgap of the p+ contact layer 1410 renders the layer absorptive. Selectively removing the p+ contact layer 1410 reduces absorption and loss in the reflection sections 1412 and 1418, as well as in the passive routing and coupler sections not shown in FIG. 14A.

As further shown in FIG. 14A, an additional n-type layer 1408, including, for example, a layer of n-type InP, may be provided above the waveguide core layer 1404. N-type layer 1408, as well as other n-type layers disclosed herein may be doped with silicon, although other n-type dopants may be used. The presence of this n-type layer 1408 further reduces loss or absorption in the reflection sections 1412 and 1418 and the phase section 1414. In addition, referring to FIG. 14B, similar to the descriptions in reference to FIG. 2A, undercut regions 1424 and 1426 may be formed under the reflection sections 1412 and 1418. In some implementations, the undercut region 1424 may also extend beneath phase section 1414.

In some implementations, one or more absorbing contact layers may be formed in the reflector section, where the absorbing contact layers are remote from the propagating mode, i.e., with sufficiently low modal overlap to reduce absorption to achieve the desirable modal loss (e.g <2-7 dB/cm). In some implementations, the reflector and/or the phase section may be orthogonal or skew to the gain section to produce a compact laser, laser array, or PIC design.

Figure 14C:
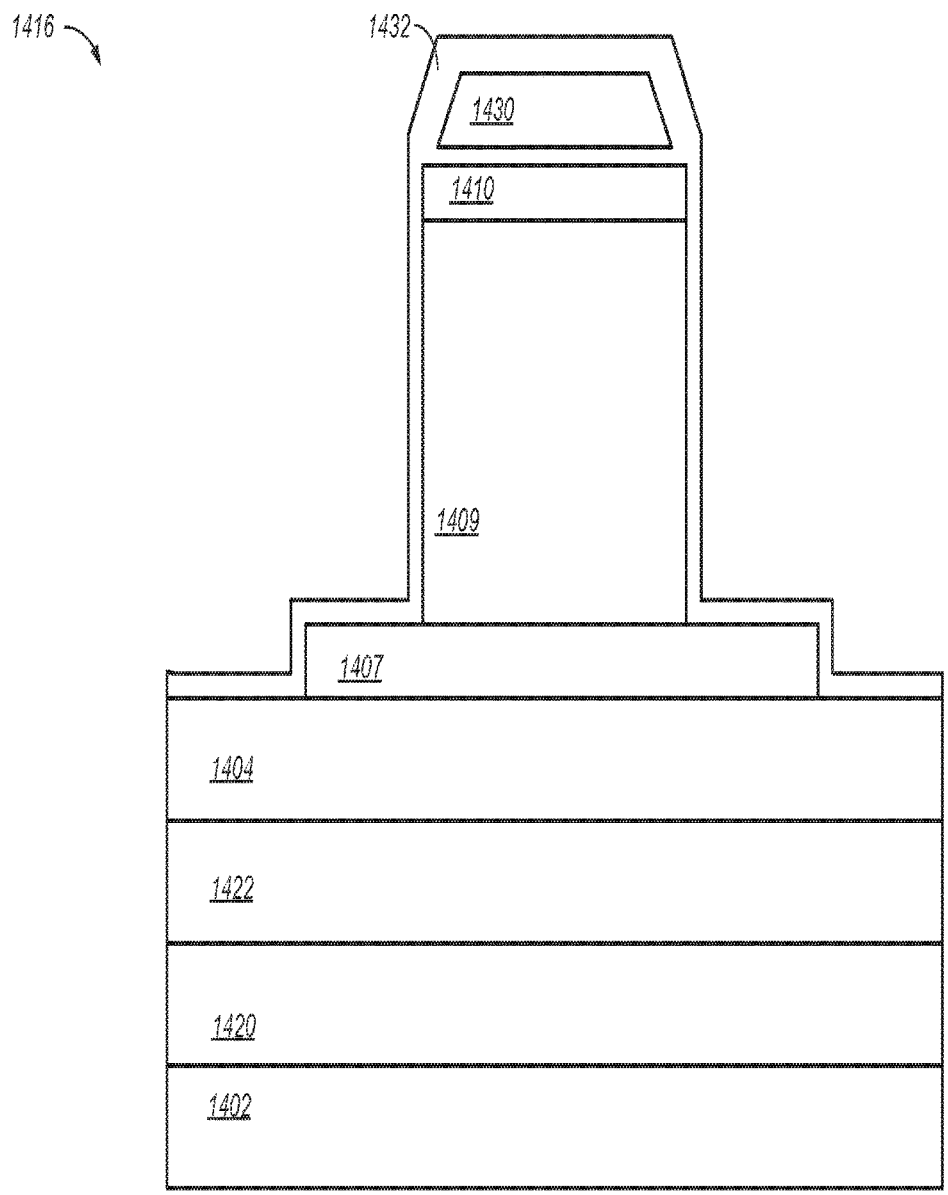

FIG. 14C shows a cross section of the tunable laser 1400 taken through the gain section 1416 that is transverse to the propagation direction of light in the laser. FIG. 14C further shows a heater 1430 for thermal tuning. As shown in FIG. 14C and as described in reference to FIG. 11, in some implementations, a dielectric 1432 may be provided that encapsulates the upper cladding layer 1406 as well as the heater 1430. The dielectric 1432 may be an oxide.

Figure 14D:
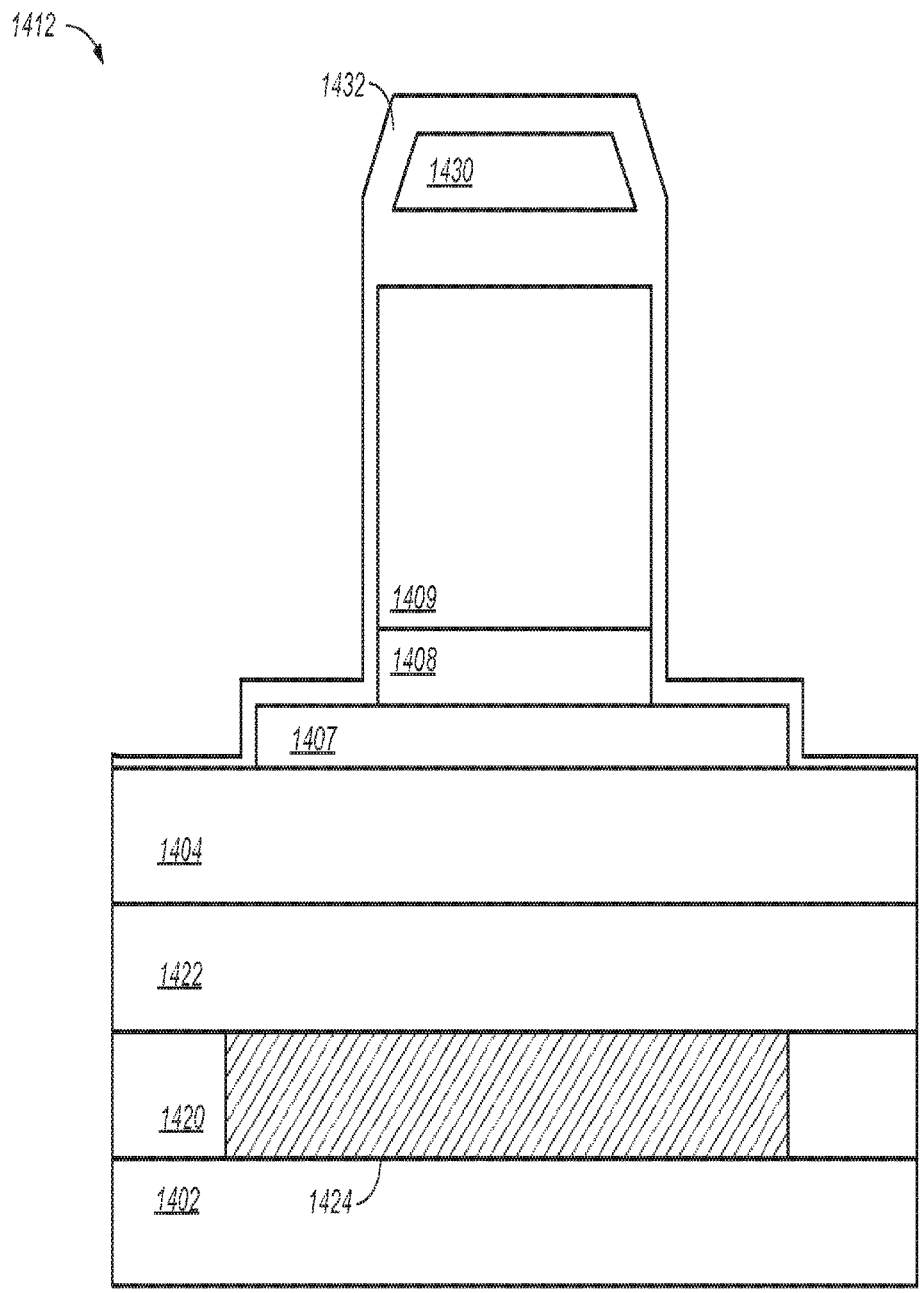

FIG. 14D shows a cross section of laser 1400 taken through a reflector section such as the reflector 1412 (or the reflector 1418). As shown in FIG. 14D, the reflector 1412 lacks the p+ contact layer 1410, but includes an n-type doped layer 1408, both of which contribute to reduced absorption in the reflector 1412.

Figure 15A:
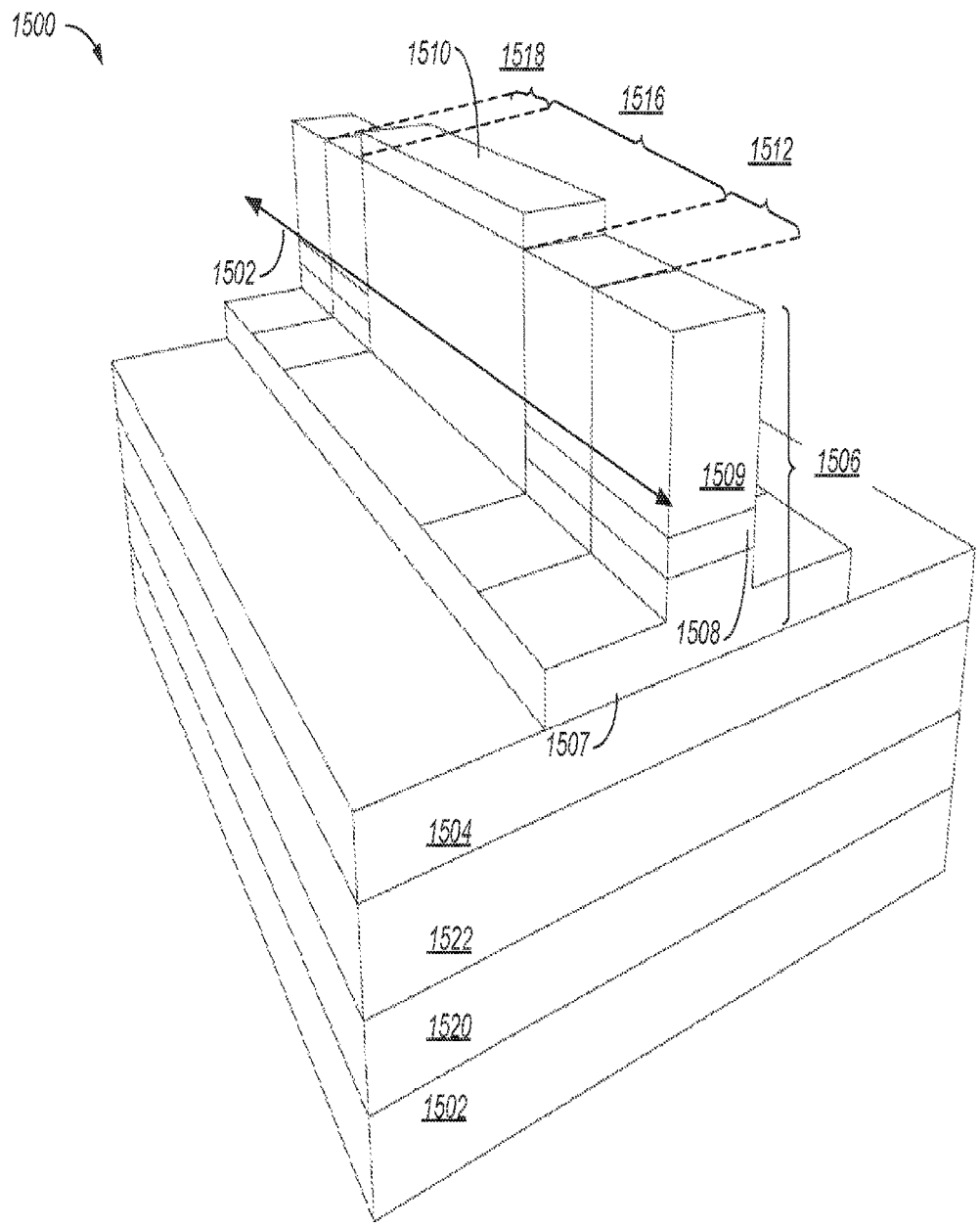
FIGS. 15A-15B illustrate an example tunable laser.
Figure 15B:
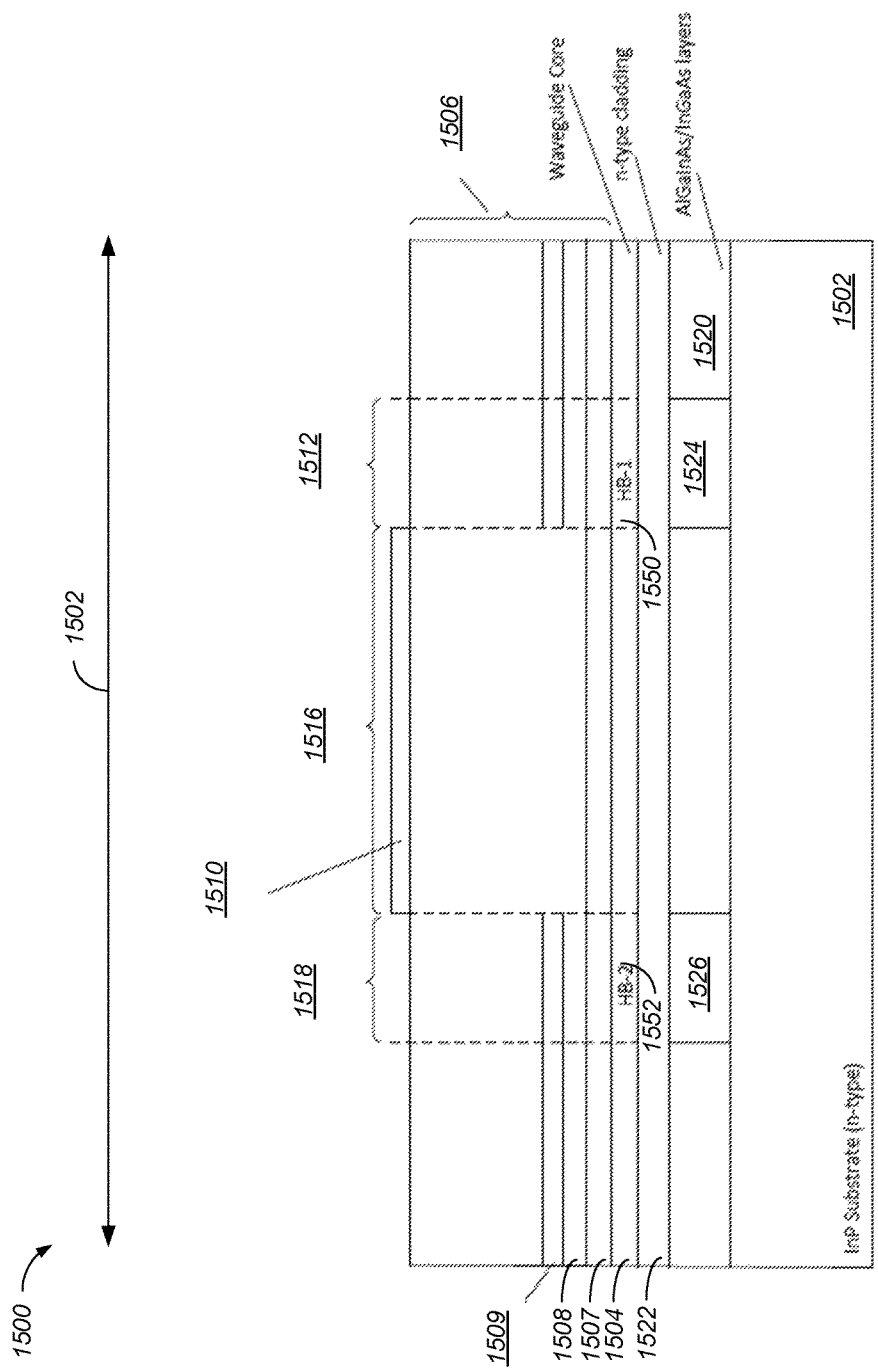

FIG. 15A shows an example tunable laser 1500 provided on substrate 1502, and FIG. 15B shows a side view of laser 1500 taken along a direction indicated by an arrow 1502. The tunable laser 1500 includes an n-type InP substrate 1502. An undercut layer 1520 is formed on the substrate 1502, and a lower cladding layer 1522 is formed on the undercut layer 1520. A waveguide core layer 1504 is formed on the lower cladding layer 1522. An upper cladding layer 1506 including a p-type layer 1507, an n-type layer 1508, and a p-type layer 1509 is provided on the waveguide core layer 1504. The tunable laser 1500 further includes a p+ contact layer 1510 that may be provided on selected portions of the p-type cladding layer. Different from the tunable laser 1400 as described in reference to FIGS. 14A and 14B, the tunable laser 1500 includes a first reflector section 1512, a gain section 1516, and a second reflector section 1518. In this example, the phase section is integrated with the gain section 1516. Referring to FIG. 15B, similar to the descriptions in reference to FIG. 2A, undercut regions 1524 and 1526 may be formed under the reflection sections 1512 and 1518.

Figure 16:
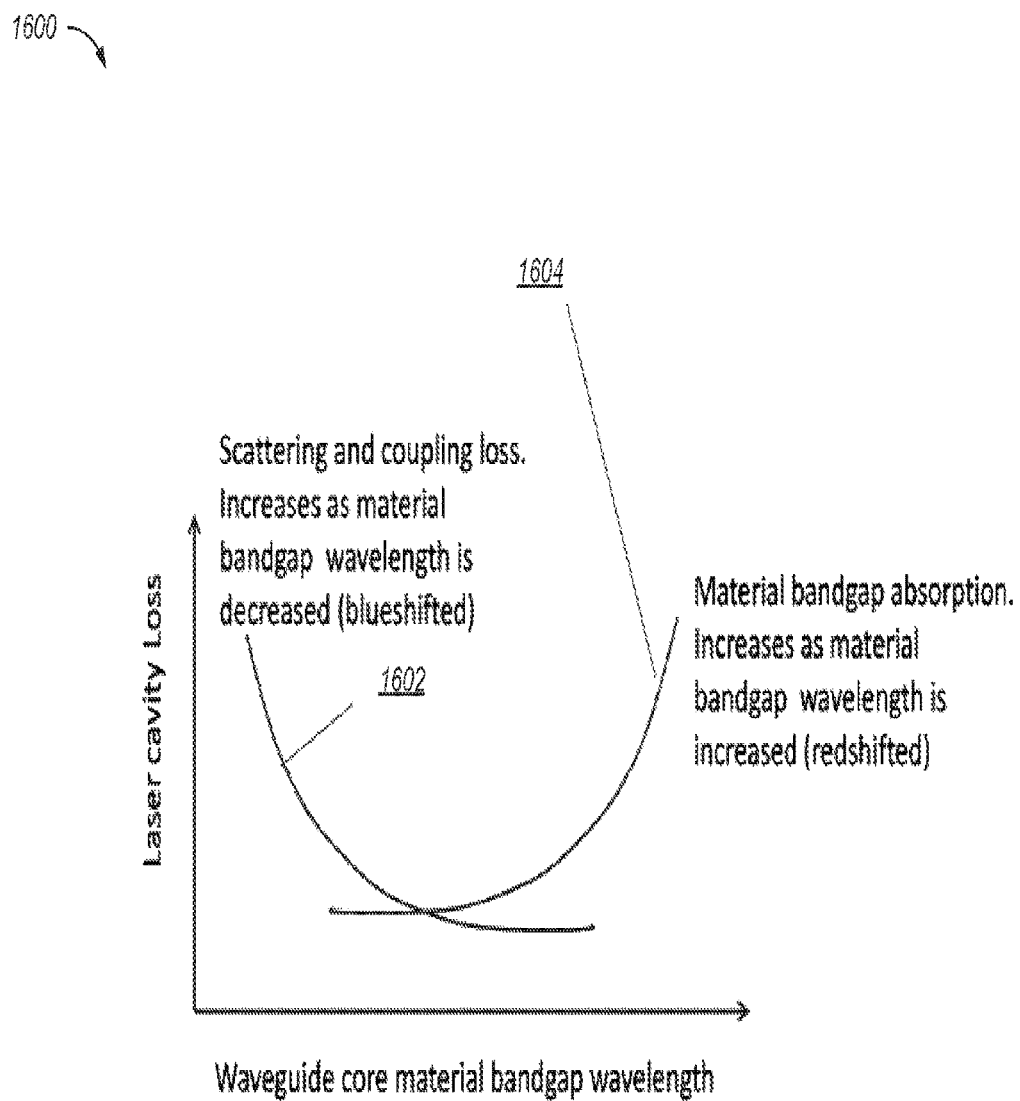
FIG. 16 shows a graph illustrating a tradeoff between bandgap energy and index contrast.

In some implementations, a reflector (e.g., reflector 1412) may include high bandgap materials in the waveguide core layer (e.g., high bandgap materials 1450 and 1452 in the waveguide core layer 1404), which may further reduce optical absorption but preserve a sufficient index contrast to maintain substantial confinement of light to the waveguide core. High bandgap materials may include InGaAsP or AlInGaAs (or interchangeably, InAlGaAs), for example. Generally, there is a tradeoff between increased bandgap energy and index contrast between the core and the cladding. FIG. 16 shows a graph 1600 illustrating this tradeoff. The graph 1600 includes a trace 1602 showing that the scattering and coupling loss increases as material bandgap wavelength decreases. The graph 1600 further includes a trace 1604 showing that the material bandgap absorption increases as material bandgap wavelength increases. An appropriate combination of bandgap and index contrast may be selected to provide a desired index contrast and sufficiently high bandgap that reduces absorption.

Figure 17:
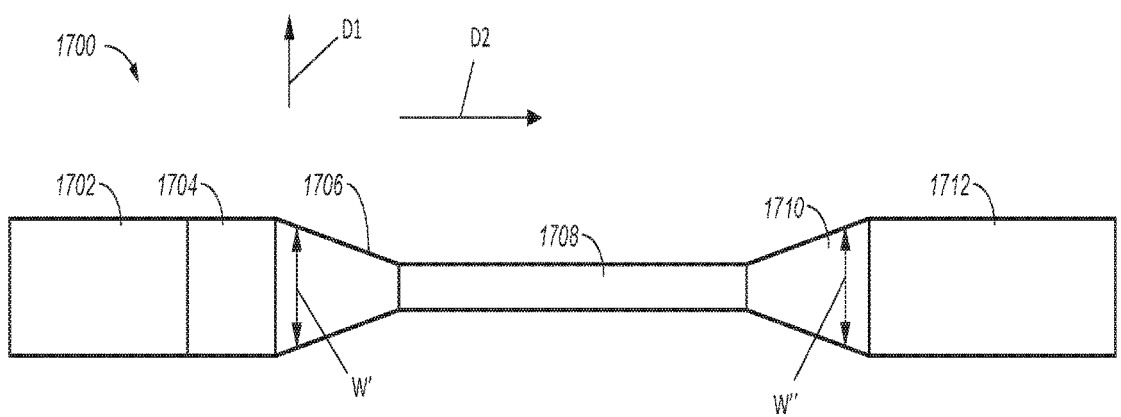
FIG. 17 shows an example tunable laser having a tapered reflector.

In accordance with a further aspect of the present disclosure, in some implementations, a reflector or a phase section may be laterally tapered or flared, as shown in FIG. 17. FIG. 17 illustrates an example tunable laser 1700 that includes a first reflector 1702, a phase section 1704, a first taper section 1706, a gain section 1708, a second taper section 1710, and a second reflector 1712. Waveguide 1700 has flared sections, as further shown in FIG. 17. In particular, first taper section 1706 between gain section 1708 and phase section 1704 (reflector 1702) has a width w' extending in a direction D1 transverse to direction D2 of light propagation in the waveguide 1700, and such width w' narrows or decreases in direction D2 toward gain section 1708. In addition, second taper section 1710 has a width w" that increases in direction D2 from gain section 1708 to second reflector 1712.

By flaring the waveguide from the gain section 1708 to the phase section 1704 or to the second reflector 1712, optical confinement is reduced, as well as the optical field intensity in the phase section 1704 and the reflectors 1702 and 1712. As a result, non-linear effects, such as two-photon absorption, may be reduced. Wider heater elements and vias may be integrated on wider mirror and phase-tuning waveguides in order to optimize the design for required drive voltage, heater current density (for reliability), and process capability of heater and via dimensions.

Figure 18:
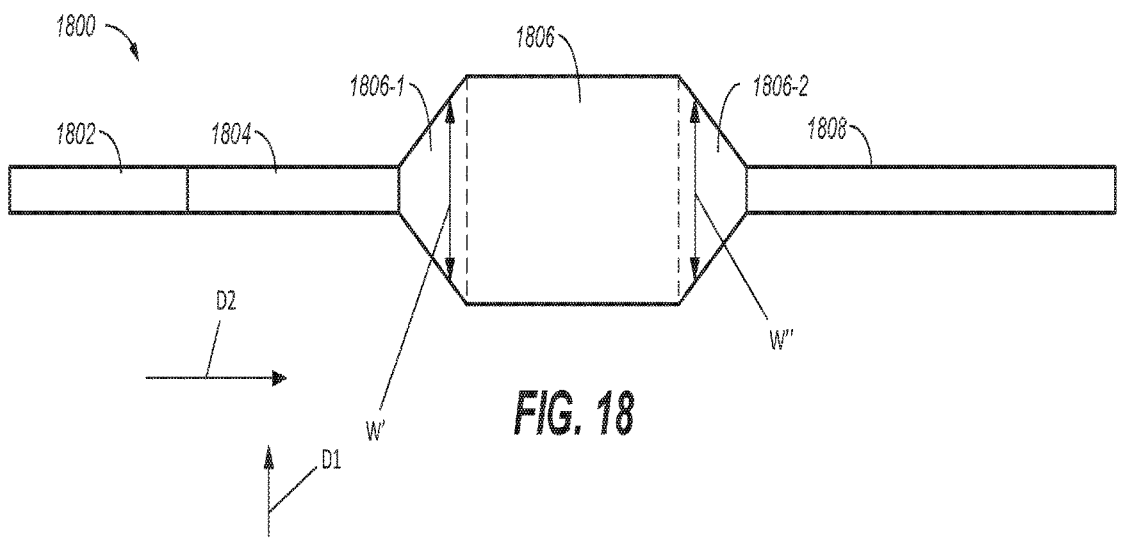
FIG. 18 shows an example tunable laser having a tapered gain section.

In accordance with a further aspect of the present disclosure, a gain section or gain sections of a tunable laser may be laterally tapered or flared to be wider than other sections in the laser. FIG. 18 shows an example tunable laser 1800 that includes a first reflector 1802, a phase section 1804, a tapered gain section 1806, and a second reflector 1808. Gain section 1806 is flared. In particular, as shown FIG. 18, gain section 1806 has a first portion 1806-1 having a width w' in a direction D1 transverse to a direction D2 of light propagation in gain section. Width w' increases in a direction D2 from phase section 1804 (or first reflector 1802) to second reflector 1808. In addition, gain section 1806 has a second portion 1806-2 with a width w" extending in direction D1. Section gain portion 1806-2 narrows or decreases in direction D2 from gain section 1806 to section reflector 1808.

By flaring the gain section 1806, a lower thermal resistance may be achieved, which improves performance of the gain section 1806 (i.e., less Auger recombination), especially when a large current is applied to the gain section and/or the substrate has a high temperature. Improved performance may also be observed in the blue (higher frequency) end of the lasing spectrum. Such gain section performance improvement may be measured through laser threshold maximum output power and linewidth across a wavelength band of interest e.g. C-band (1530-1565 nm).

Figure 19:
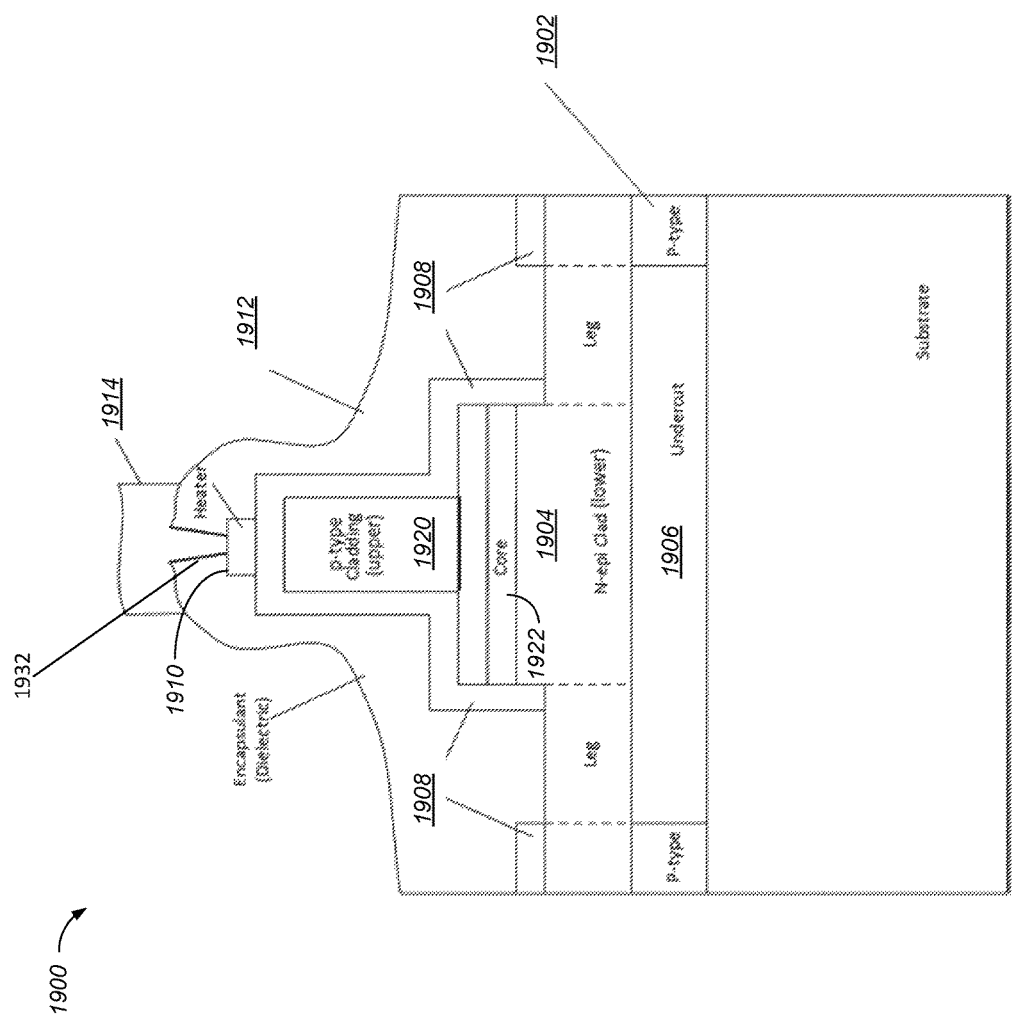
FIG. 19 illustrates a cross sectional view of an example tunable section that is taken along a leg of a tunable laser.

FIG. 19 illustrates a cross sectional view of an example tunable section 1900 (mirror or phase) that is taken along a leg (e.g., leg 208a in FIG. 2A) of a tunable laser. The tunable section 1900 includes a lightly doped p-type portion 1902 provided under a portion of the lower cladding layer 1904 (e.g., an n-type epitaxial layer) and adjacent to an undercut 1906 to provide electrical isolation with minimum impact to topography that may otherwise compromise contacts, vias, and heaters. This p-type material 1902 replaces the more conductive n-type material to facilitate electrical isolation of the lower cladding layer 1904 in one portion of the circuit from another, which can be advantageous if the n-type (ground) portions of a PIC including tunable lasers, variable optical attenuators (VOAs), photodiodes, phase adjusters, or other elements are biased differently (multiple grounds on PIC), and failure to adequately isolate such n-type portions can result in excessive ground currents.

As further shown in FIG. 19, a dielectric layer 1908 may be provided above the lower cladding layer 1904 and a p-type upper cladding 1920. In addition, a heater 1910 may be provided on the dielectric 1908, and an encapsulating layer 1912 (or planarization layer), which also may include a dielectric material, may be provided over the entire device 1900. Further, an opening or via 1932 may be provided in the encapsulating layer 1912 over the heater 1910. A metal or other conductive material 1914 may then be provided in the via 1932 to provide electrical contact to the heater 1910. In some implementations, the contact via 1932 is provided at an end of the heater 1910.

The laser shown in FIG. 19 has a shallow ridge waveguide having a core 1922, although it is understood that the waveguide may be deep etched through the core.

Other embodiments will be apparent to those skilled in the art from consideration of the specification. It is intended that the specification and examples be considered as exemplary only.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

The invention claimed is:

1. A semiconductor laser, comprising:
   a substrate;
   a layer formed on the substrate, the layer having first and second regions, the first region of the layer including one or more voids; and
   a mirror section provided on the layer, the mirror section comprising:
      a waveguide core, wherein at least part of the waveguide core is provided over a first void,
      a grating,
      a first cladding provided between the layer and the waveguide core, wherein at least a portion of the first cladding is provided over at least a portion of the second region of the layer, and
      a second cladding provided on the waveguide core; and
   a first electrode and a second electrode, the first electrode being coupled to the second cladding, such that a current flows between the first and second electrodes and through at least a portion of the second cladding, such that heat generated by the current adjusts a temperature of a portion of the waveguide core.

2. A semiconductor laser in accordance with claim 1, wherein the first electrode is coupled to the second cladding at a plurality of locations along the second cladding.

3. A semiconductor laser in accordance with claim 1, wherein the first electrode is coupled to the second cladding at a first plurality of locations along the second cladding, and the second electrode is coupled to the second cladding at a second plurality of locations along the second cladding.

4. The laser of claim 1, wherein the grating includes a plurality of grating bursts, such that a first location in said one of the plurality of support legs has a minimum temperature relative to a temperature at remaining second locations in said one of the plurality of support legs, the first location being misaligned relative to a center of one of the plurality of grating bursts.

5. The laser of claim 1, wherein a first spacing between first and second successive support legs of the plurality of support legs is different from a second spacing between third and fourth successive support legs of the plurality of support legs.

6. The laser of claim 1, wherein the grating includes a plurality of grating bursts,
wherein the grating includes a plurality of grating bursts, the plurality of grating bursts extending over a portion of the mirror section, such that, in the portion of the mirror section, a support leg pitch between two successive support legs is different than a grating burst pitch between two successive grating bursts of the plurality of grating bursts.

7. The laser of claim 1, wherein the mirror section has a substantially uniform thermal distribution along the mirror section such that a difference between a peak temperature of the mirror section and an average temperature of the first mirror section is less than 10° C.

8. The laser of claim 1, wherein the first mirror section has a substantially uniform thermal distribution along the mirror section such that a difference between a peak temperature of the mirror section and an average temperature of the mirror section is less than 5° C.

9. The semiconductor laser of claim 1, wherein an optical mode propagating in the mirror section incurs a loss that is less than 7 dB/cm.

10. The semiconductor laser of claim 1, wherein an optical mode propagating in the mirror section incurs a loss that is less than 5 dB/cm.

11. The semiconductor laser of claim 1, wherein an optical modal propagating in the mirror section incurs a loss that is less than 2.5 dB/cm.

12. The semiconductor laser of claim 1,
wherein at least one of one or more deleterious device layers does not extend into the mirror section.

13. The semiconductor laser of claim 12, wherein a deleterious device layer of the one or more deleterious device layers includes a bandgap wavelength that is greater than an operating wavelength of the semiconductor laser.

14. A semiconductor laser, comprising:
a substrate;
a layer formed on the substrate, the layer having first and second regions, the first region of the layer including one or more voids;
a gain section provided on the layer, the gain section comprising:
a first waveguide core, wherein at least part of the first waveguide core is provided over the second region of the layer;
a p-type region and an n-type region that form a p-n junction; and
a contact layer configured to apply a voltage to forward bias the p-n junction of the gain section;
a first mirror section provided on the layer, the first mirror section comprising:
a second waveguide core, wherein at least part of the second waveguide core is provided over a first void; and
a first grating;
a second mirror section, the second mirror section comprising:
a third waveguide core, wherein at least part of the third waveguide core is provided over a second void; and
a second grating; and
a heat source arranged adjacent to the gain section, the heat source configured to change a temperature of the first waveguide core to thereby change a phase of light propagating in the first waveguide core.

15. The semiconductor laser of claim 14, wherein the heat source is encapsulated by a combination of one or more dielectric layers and one or more metal layers.

16. The semiconductor laser of claim 14, wherein the heat source comprises a plurality of metal layers.

17. A semiconductor laser, comprising:
a substrate;
a layer formed on the substrate, the layer having first and second regions, the first region of the layer including one or more voids;
a gain section provided on the layer, the gain section comprising:
a first waveguide core, wherein at least part of the first waveguide core is provided over the second region of the layer;
a p-type region and an n-type region that form a p-n junction; and
a contact layer provided on the first waveguide core, the contact layer being configured to apply a voltage to forward bias the p-n junction of the gain section;
a first mirror section provided on the layer, the first mirror section comprising:
a second waveguide core, wherein at least part of the second waveguide core is provided over a first void; and
a first grating;
a phase section provided on the layer, the phase section comprising:
a third waveguide core;
a second mirror section, the second mirror section comprising:
a fourth waveguide core, wherein at least part of the fourth waveguide core is provided over a second void; and
a second grating; and
a heat source arranged adjacent to the first mirror section or the second mirror section, the heat source configured to change a temperature of one or more of the second waveguide core, the first grating, the fourth waveguide core, or the second grating.

18. The laser of claim 17, further comprising a plurality of support legs provided between the second waveguide core and the substrate,
wherein the first grating includes a plurality of grating bursts, at least part of one of the plurality of support legs is misaligned relative to at least a portion of one of the grating bursts, such that a local minimum temperature dip in said one of the plurality of support legs is misaligned relative to a center of said one of the plurality of grating bursts.

19. The laser of claim 17, further comprising a plurality of support legs provided between the second waveguide core and the substrate,
wherein a first spacing between first and second successive support legs of the plurality of support legs is different from a second spacing between third and fourth successive support legs of the plurality of support legs.

20. The laser of claim 17, further comprising a plurality of support legs provided between the second waveguide core and the substrate,
  wherein the first grating includes a plurality of grating bursts, a spacing between two successive support legs within the first mirror section of the plurality of support legs is less than a spacing between two successive grating bursts of the plurality of grating bursts.

21. The laser of claim 17, wherein the first mirror section has a substantially uniform thermal distribution along the first mirror section such that a difference between a peak temperature of the first mirror section and an average temperature of the first mirror section is less than 10° C.

22. The laser of claim 17, wherein the first mirror section has a substantially uniform thermal distribution along the first mirror section such that a difference between a peak temperature of the first mirror section and an average temperature of the first mirror section is less than 5° C.

23. The semiconductor laser of claim 17, wherein an optical mode propagating in the first mirror section or the second mirror section incurs a loss that is less than 7 dB/cm.

24. The semiconductor laser of claim 17, wherein an optical mode propagating in the first mirror section or the second mirror section incurs a loss that is less than 5 dB/cm.

25. The semiconductor laser of claim 17, wherein an optical modal propagating in the first mirror section or the second mirror section incurs a loss that is less than 2.5 dB/cm.

26. The semiconductor laser of claim 17,
  wherein at least one of one or more deleterious device layers does not extend into the first mirror section or the second mirror section.

27. The semiconductor laser of claim 26, wherein a deleterious device layer of the one or more deleterious device layers includes a bandgap wavelength that is greater than an operating wavelength of the semiconductor laser.

28. The semiconductor laser of claim 17, wherein the heat source is encapsulated by a combination of one or more dielectric layers and one or more metal layers.

29. The semiconductor laser of claim 17, wherein the heat source comprises a plurality of metal layers.

30. The semiconductor laser of claim 17, wherein one or more of the first mirror section or the second mirror section is arranged to be not parallel to the optical axis of the gain section.

* * * * *